United States Patent
Nendai et al.

(12) 
(10) Patent No.: US 11,469,281 B2
(45) Date of Patent: Oct. 11, 2022

(54) ORGANIC EL DISPLAY PANEL AND MANUFACTURING METHOD OF ORGANIC EL DISPLAY PANEL

(71) Applicant: JOLED Inc., Tokyo (JP)

(72) Inventors: Kenichi Nendai, Tokyo (JP); Jiro Yamada, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/802,579

(22) Filed: Feb. 27, 2020

(65) Prior Publication Data

US 2020/0279897 A1    Sep. 3, 2020

(30) Foreign Application Priority Data

Mar. 1, 2019 (JP) .............................. JP2019-37762
Dec. 12, 2019 (JP) ............................. JP2019-224289

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3211* (2013.01); *H01L 27/3258* (2013.01); *H01L 27/3276* (2013.01); *H01L 27/3279* (2013.01); *H01L 51/5206* (2013.01); *H01L 51/5221* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 5,443,922 A | 8/1995 | Nishizaki et al. |
| 2013/0134449 A1* | 5/2013 | Chen .................... H01L 27/329 257/88 |
| 2014/0346459 A1* | 11/2014 | Song ..................... H01L 51/56 257/40 |

(Continued)

FOREIGN PATENT DOCUMENTS

| JP | 05-163488 B2 | 6/1993 |
| JP | 2006-278212 A | 10/2006 |
| JP | 2007-227129 A | 9/2007 |

*Primary Examiner* — Shaun M Campbell
*Assistant Examiner* — Aneta B Cieslewicz
(74) *Attorney, Agent, or Firm* — Xsensus LLP

(57) ABSTRACT

Disclosed is an organic EL display panel including: a substrate; a planarization layer being disposed on an upper surface of the substrate and containing a resin material; plural pixel electrodes being disposed in a matrix manner on the planarization layer; a light emitting layer being disposed on the pixel electrodes and containing an organic luminescent material; and a common electrode covering at least an upper side of the light emitting layer and being disposed continuously in a plane direction. A recessed part is opened to extend in a column direction in at least one gap between the pixel electrodes adjacent to each other in a row direction on the planarization layer, the common electrode is disposed continuously in the recessed part, and a power feed auxiliary interconnect extending in the column direction and formed of an applied film is disposed on an upper surface of the common electrode.

11 Claims, 16 Drawing Sheets

(56) References Cited

U.S. PATENT DOCUMENTS

2014/0346484 A1* 11/2014 Nendai .................. H01L 51/56
                                                            257/40
2017/0213881 A1* 7/2017 Kondo ................ H01L 27/3211
2019/0363279 A1* 11/2019 Yamaguchi ......... H01L 51/5253

* cited by examiner

ORGANIC EL DISPLAY PANEL AND MANUFACTURING METHOD OF ORGANIC EL DISPLAY PANEL

CROSS-REFERENCE TO RELATED APPLICATIONS

The present application claims priority to JP 2019-37762, filed Mar. 1, 2019, and JP 2019-224289, filed Dec. 12, 2019, the entire contents of each are incorporated herein by reference.

BACKGROUND

The present disclosure relates to an organic electroluminescence (EL) display panel using an electroluminescence phenomenon of an organic material and a manufacturing method thereof.

In the past, the organic EL display panel including plural organic EL elements has been known. The organic EL element has a multilayer structure obtained by stacking thin films of various materials and includes at least a pixel electrode, a common electrode, and an organic light emitting layer sandwiched by them over a thin film transistor (TFT) substrate covered by a planarization insulating layer.

The organic EL element applies a voltage between the pixel electrode and the common electrode and emits light in association with recombination of holes and electrons injected into the light emitting layer. In the organic EL element of the top-emission type, light from the light emitting layer is reflected at the pixel electrode composed of a light reflective material and is emitted upward from the common electrode composed of a light translucent material. The common electrode is frequently deposited over the whole surface of the substrate and is electrically connected to a power feed unit for supplying a current to the organic EL element through an electrode plate disposed in a peripheral region other than an image display region.

At this time, when the electrical resistance of the common electrode is high, possibly luminance lowering associated with a voltage drop at the central part of the display panel occurs. As a countermeasure thereagainst, for example, a method has been proposed in which a power feed auxiliary interconnect that traverses the inside of a display panel is disposed at the same level as a pixel electrode to intend reduction in the resistance of a common electrode (for example, Japanese Patent Laid-Open No. 2006-278212 and Japanese Patent Laid-Open No. 2007-227129 (hereinafter, Patent Documents 1 and 2, respectively)).

SUMMARY

However, in the related-art display panel described in Patent Document 1 or 2, luminance variation in the surface attributed to a voltage drop at the central part occurs in some cases in association with increase in the size of the display panel. Thus, further reduction in the resistance of the power feed path to the light emitting elements is necessary.

The present disclosure is made in view of the above-described problem, and it is desirable to reduce the resistance of a power feed path to light emitting elements in an organic EL panel and provide an organic EL display panel that suppresses luminance variation in the surface attributed to a voltage drop and a manufacturing method thereof.

According to an embodiment of the present disclosure, there is provided an organic EL display panel including a substrate, a planarization layer configured to be disposed on an upper surface of the substrate and contain a resin material, a plurality of pixel electrodes configured to be disposed in a matrix manner on the planarization layer, a light emitting layer configured to be disposed on the pixel electrodes and contain an organic luminescent material, and a common electrode configured to cover at least the upper side of the light emitting layer and be disposed continuously in a plane direction. An elongated-shaped recessed part is opened to extend in a column direction in at least one gap in gaps between the pixel electrodes adjacent to each other in a row direction on the planarization layer. The common electrode is disposed continuously in the recessed part of the planarization layer. A power feed auxiliary interconnect that extends in the column direction and is formed of an applied film is disposed on an upper surface of the common electrode located in the recessed part of the planarization layer.

According to the display panel in accordance with the mode of the present disclosure and a manufacturing method of the display panel, reduction in the resistance of the power feed path to the light emitting elements can be intended in the organic EL panel and luminance variation in the surface attributed to a voltage drop can be suppressed.

DETAILED DESCRIPTION OF THE PREFERRED EMBODIMENT

Figure 1:
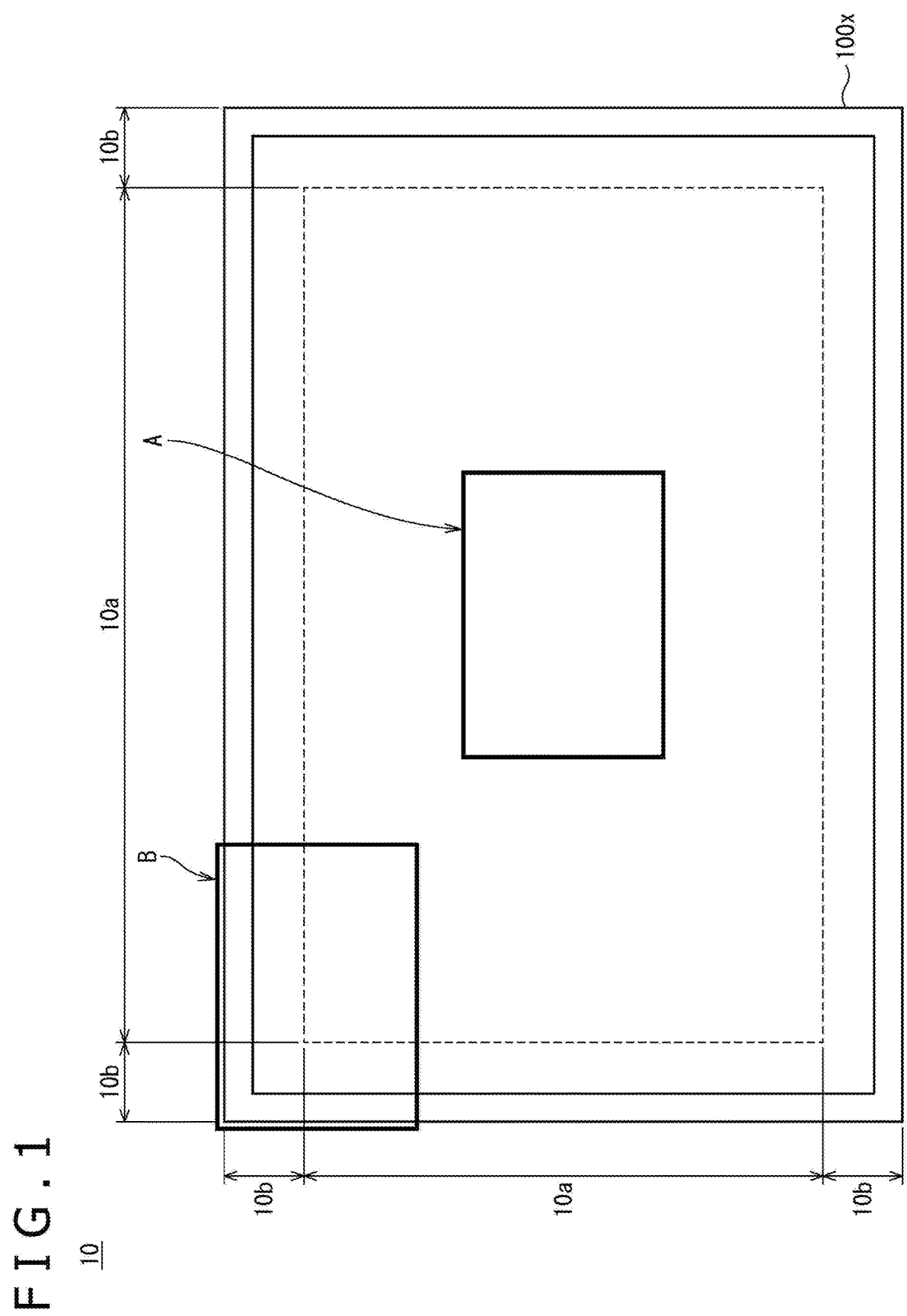
FIG. 1 is a plan view of an organic EL display panel according to embodiment 1.

<<Outline of Modes for Carrying Out Present Disclosure>>

A display panel according to an embodiment of the present disclosure includes a substrate, a planarization layer that is disposed on the upper surface of the substrate and contains a resin material, plural pixel electrodes that are disposed in a matrix manner on the planarization layer, a light emitting layer that is disposed on the pixel electrodes and contains an organic luminescent material, and a common electrode that covers at least the upper side of the light emitting layer and is disposed continuously in the plane direction. An elongated-shaped recessed part is opened to extend in the column direction in at least one gap in gaps between the pixel electrodes adjacent to each other in the row direction on the planarization layer. The common electrode is disposed continuously in the recessed part of the planarization layer. A power feed auxiliary interconnect that extends in the column direction and is formed of an applied film is disposed on the upper surface of the common electrode located in the recessed part of the planarization layer.

According to this configuration, the auxiliary interconnect formed in the recessed part can ensure a sectional area equivalent to that of the sectional shape of the recessed part obtained by cutting in the row direction. Thus, reduction in the resistance of the power feed path to the light emitting elements can be intended in the organic EL panel and luminance variation in the surface attributed to a voltage drop can be suppressed. Furthermore, crosstalk attributed to the lowering of the responsiveness at the central part of the display panel is suppressed and the display quality can be improved.

Furthermore, in another mode, in the above-described mode, a configuration may be employed in which two elongated-shaped column banks are further formed to extend in the column direction between the recessed part and the pixel electrodes each adjacent to the recessed part on both sides in the row direction on the planarization layer and the depth of the recessed part of the planarization layer is larger than the height of the column banks.

According to this configuration, the auxiliary interconnect has a predetermined thickness, which can lower the electrical resistance of the auxiliary interconnect.

Moreover, in another mode, in any of the above-described modes, a configuration may be employed in which a lower-layer power feed auxiliary interconnect that extends in the column direction and is formed of a vapor-deposited film is disposed in the recessed part of the planarization layer and under the common electrode.

According to this configuration, the section of the column bank adjacent to the recessed part in the row direction can be allowed to have an equivalent shape in the row direction.

Furthermore, in another mode, in any of the above-described modes, the following configuration may be employed. The display panel further includes an electrode plate that extends along the peripheral edge of the substrate outside a region in which the pixel electrodes exist in plan view on the planarization layer. The recessed part of the planarization layer is opened to the vicinity of the peripheral edge of the substrate in plan view. The electrode plate is disposed continuously in the recessed part of the planarization layer. The power feed auxiliary interconnect extends to the upper surface of the electrode plate in plan view.

According to this configuration, the power feed auxiliary interconnect formed in the recessed part is extended to the peripheral edge of the substrate in the state of ensuring a sectional area equivalent to the sectional area of the recessed part by having a predetermined thickness.

Moreover, in another mode, in any of the above-described modes, a configuration in which the common electrode extends to the upper surface of the electrode plate in plan view may be employed.

According to this configuration, the power feed auxiliary interconnect formed in the recessed part is connected to the electrode plate existing at the peripheral edge of the substrate and is connected to the external connection terminal in the state of ensuring a sectional area equivalent to the sectional area of the recessed part by having a predetermined thickness. Thus, reduction in the resistance of the power feed path from the electrode plate to an organic EL element array can be intended.

Furthermore, in another mode, in any of the above-described modes, the following configuration may be employed. The recessed part of the planarization layer is opened to an end point located outside a region in which the pixel electrodes exist and inside relative to the electrode plate in plan view. The power feed auxiliary interconnect extends to the end point in plan view. The common electrode extends to the upper surface of the electrode plate in plan view.

According to this configuration, the power feed auxiliary interconnect is electrically connected to the electrode plate through the common electrode in the peripheral region and reduction in the resistance of the power feed path from the electrode plate to the organic EL element array can be intended.

Moreover, in another mode, in any of the above-described modes, a configuration may be employed in which the depth of the recessed part of the planarization layer is at least 2 μm and at most 5 μm and the power feed auxiliary interconnect includes silver and has a thickness of at least 0.5 μm and at most 2 μm.

According to this configuration, the auxiliary interconnect is given the above-described thickness, which can lower the electrical resistance of the auxiliary interconnect.

Furthermore, in another mode, in any of the above-described modes, the following configuration may be employed. When the recessed part is defined as a first recessed part and the power feed auxiliary interconnect is defined as a first power feed auxiliary interconnect, an elongated-shaped second recessed part is further opened to extend in the row direction in at least one gap in gaps between the pixel electrodes adjacent to each other in the column direction on the planarization layer.

The common electrode is disposed continuously in the second recessed part of the planarization layer. A second power feed auxiliary interconnect that extends in the row direction and is formed of an applied film is disposed on the upper surface of the common electrode located in the second recessed part of the planarization layer.

According to this configuration, the electrical resistance of the common electrode is reduced also in the row direction in addition to the column direction and luminance variation in the surface attributed to a voltage drop can be reduced.

Moreover, in another mode, in any of the above-described modes, a configuration may be employed in which the positions of the second recessed part and the second power feed auxiliary interconnect in the column direction differ depending on the positions in the row direction regarding the pixel electrodes that sandwich the gap in which the second recessed part is opened in the column direction.

According to this configuration, what is called a staggered shape is formed. Therefore, luminance variation in the column direction (horizontal streak) due to the existence of the power feed auxiliary interconnect can be made inconspicuous.

Furthermore, in another mode, in any of the above-described modes, a configuration may be employed in which the second recessed part and the second power feed auxiliary interconnect are disposed at every group of plural pixel electrodes in the column direction.

According to this configuration, the occurrence of luminance variation attributed to application variation of the ink on each sub-pixel basis in the column direction can be deterred.

Moreover, in another mode, in any of the above-described modes, a configuration may be employed in which two elongated-shaped row banks are formed to extend in the row direction between the second recessed part and the pixel electrodes each adjacent to the second recessed part on both sides in the column direction on the planarization layer and the height of the row banks is smaller than the depth of the second recessed part.

According to this configuration, when ink containing an organic luminescent material is applied into the gap between the column banks in the forming step of the light emitting layer, the applied ink can be dammed up by the row bank. Thus, the ink can be prevented from flowing from the inside of the gap into the recessed part in which the auxiliary interconnect is laid.

Furthermore, in another mode, in any of the above-described modes, a configuration may be employed in which the pixel electrodes and the lower-layer power feed auxiliary interconnect are formed of vapor-deposited films and the pixel electrodes and the lower-layer power feed auxiliary interconnect are composed of the same material.

According to this configuration, the pixel electrodes and the lower-layer power feed auxiliary interconnect can be simultaneously deposited and patterned at the time of manufacturing.

Moreover, in another mode, in any of the above-described modes, a configuration in which the common electrode is formed of a vapor-deposited film and is formed continuously above the column banks may be employed.

According to this configuration, the structure in which the common electrode is disposed continuously in the recessed part of the planarization layer can be implemented.

Furthermore, in another mode, in any of the above-described modes, the following configuration may be employed. When the column banks are defined as first column banks, elongated-shaped second column banks are further formed to extend in the column direction between the pixel electrodes adjacent to each other in the row direction on the planarization layer. The light emitting layer is formed of an applied film and is disposed continuously in the column direction in gaps between the first column bank and the second column bank and in gaps between the second column banks adjacent to each other in the row direction.

According to this configuration, even when the power feed auxiliary electrode that extends over the substrate in the column direction is disposed, the occurrence of luminance variation attributed to application variation of ink on each sub-pixel basis in the column direction can be deterred.

A manufacturing method of a display panel according to an embodiment of the present disclosure includes preparing a substrate, forming a planarization layer that is disposed on the upper surface of the substrate and contains a resin material, forming plural pixel electrodes in a matrix manner on the planarization layer, forming a light emitting layer that is disposed on the pixel electrodes and contains an organic luminescent material, and disposing a common electrode continuously in the plane direction in such a manner as to cover at least the upper side of the light emitting layer. In the forming the planarization layer, an elongated-shaped recessed part is opened to extend in the column direction in at least one gap in gaps between regions in which the pixel electrodes adjacent to each other in the row direction are to be formed on the planarization layer. In the disposing the common electrode, the common electrode is formed continuously in the recessed part of the planarization layer. The manufacturing method further has forming a power feed auxiliary interconnect that extends in the column direction and is formed of an applied film on the upper surface of the common electrode located in the recessed part of the planarization layer after the disposing the common electrode.

According to this configuration, it is possible to manufacture an organic EL panel in which reduction in the resistance of a power feed path to light emitting elements is intended and luminance variation in the surface attributed to a voltage drop is suppressed.

Moreover, in another mode, in the above-described mode, the following configuration may be employed. The manufacturing method further has forming two elongated-shaped column banks that extend in the column direction between the recessed part and the pixel electrodes each adjacent to the recessed part on both sides in the row direction on the planarization layer after the forming the pixel electrodes and before the forming the light emitting layer. In the forming the power feed auxiliary interconnect, the power feed auxiliary interconnect is formed by applying ink that contains a metal material into a gap between the column banks and drying the ink.

According to this configuration, due to the existence of the recessed part in the gap, the ink can be prevented from spilling over to the adjacent gap and blocking the light emitting layer in the adjacent gap even when a large amount of ink is applied into the gap. Due to this, the thickness of the auxiliary interconnect can be increased while leakage of the ink to the sub-pixels is prevented.

Furthermore, in another mode, in any of the above-described modes, a configuration may be employed in which in the forming the pixel electrodes, a lower-layer power feed auxiliary interconnect that extends in the column direction and is formed of a vapor-deposited film is further formed in the recessed part of the planarization layer and under the common electrode.

According to this configuration, blocking of the light emitting layer in association with spilling of ink to the gap adjacent to the recessed part in the row direction can be deterred.

Embodiment

An organic EL display panel 10 (hereinafter, referred to as "display panel 10") according to the present embodiment will be described by using the drawings. The drawings are schematic diagrams and the scale thereof is different from the actual scale in some cases.

<Overall Configuration of Display Panel 10>

Figure 2:
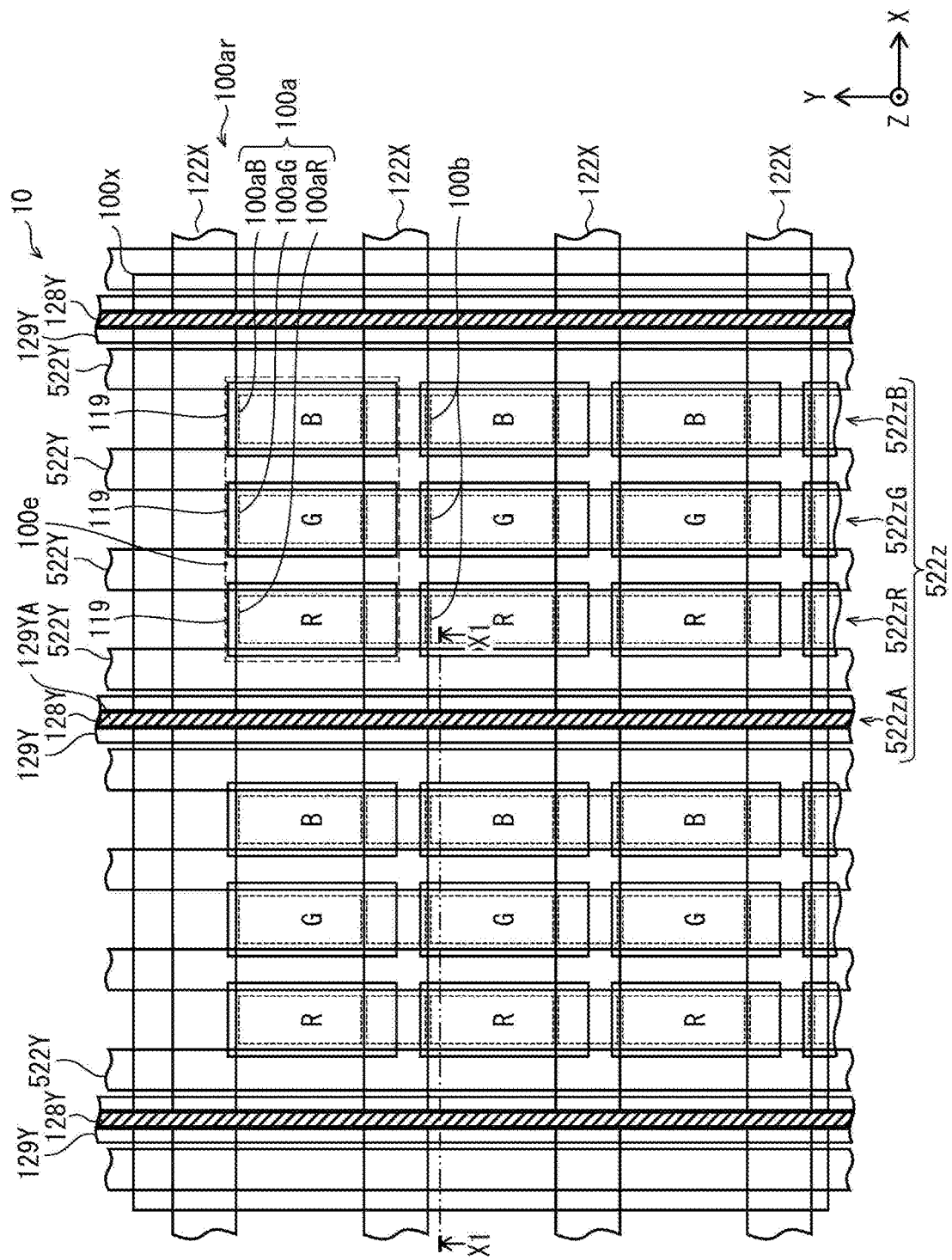
FIG. 2 is a schematic plan view of part A in FIG. 1.

FIG. 1 is a plan view of the display panel 10 according to embodiment 1. FIG. 2 is an enlarged view of part A in FIG. 1. The display panel 10 is an organic EL panel using an electroluminescence phenomenon of an organic material and is configured through arranging plural organic EL elements in a matrix manner, for example. As depicted in FIG. 1, in plan view, the display panel 10 has an image display region 10a and a peripheral region 10b located outside the image display region 10a in the substrate.

<Configuration of Image Display Region 10a of Display Panel 10>

In the image display region 10a, plural unit pixels 100e are arranged in a matrix manner. Each unit pixel 100e includes plural sub-pixels 100se different in the light emission color and one sub-pixel 100se includes one organic EL element 100. These plural organic EL elements 100 are arranged in a matrix manner in the image display region 10a of the display panel 10 and configure an organic EL element array 100ar. As depicted in FIG. 2, in the image display region 10a of the display panel 10, the unit pixels 100e that each have a pixel electrode 119 and include the sub-pixels 100se of R, G, and B are arranged in a matrix manner and configure the organic EL element array 100ar.

FIG. 2 is a schematic plan view depicting a part in the image display region 10a of the display panel 10 and is a diagram depicting the state in which a light emitting layer 123, an electron transport layer 124, a common electrode 125, a sealing layer 126, and a front surface plate 131 that will be described later are removed. Here, in the present specification, X direction, Y direction, and Z direction in FIG. 2 are deemed as row direction, column direction, and thickness direction, respectively, in the display panel 10.

The display panel 10 has a configuration of the top-emission type in which plural organic EL elements 100 each configuring a pixel are disposed in a matrix manner over a substrate 100x on which thin film transistors (TFTs) are formed (TFT substrate) and that emits light from the upper surface.

The display panel 10 includes the image display region 10a in which column banks 522Y and row banks 122X (referred to as "banks 122" collectively) that segment the upper surface of the substrate 100x in a matrix manner and regulate the light emission unit of each color of red, green, and blue (RGB) are disposed. In the image display region 10a of the display panel 10, the sub-pixels 100se corresponding to the organic EL elements 100 are disposed in a matrix manner. In each sub-pixel 100se, any of three kinds of self-luminescence regions 100a, i.e., a region 100aR that emits red light, a region 100aG that emits green light, and a region 100aB that emits blue light (referred to as "100a" when no discrimination is made), is formed. The unit pixel 100e includes the three sub-pixels 100se corresponding to the self-luminescence regions 100aR, 100aG, and 100aB lined up in the row direction.

Furthermore, in the display panel 10, plural pixel electrodes 119 are disposed in a matrix manner in the state of being separated from each other by a predetermined distance in the row and column directions over the substrate 100x. The pixel electrode 119 has a rectangular shape in plan view and is composed of a light reflective material and corresponds to the self-luminescence region 100a.

In the display panel 10, as the shape of the bank 122, a bank format with what is called a line shape is employed. Between the respective two pixel electrodes 119 adjacent in the row direction, plural column banks 522Y whose each strip extends in the column direction (Y direction in FIG. 2) are juxtaposed in the row direction.

Meanwhile, between the respective two pixel electrodes 119 adjacent in the column direction, plural row banks 122X whose each strip extends in the row direction (X direction in FIG. 2) are juxtaposed in the column direction. The region in which the row bank 122X is formed serves as a non-self-luminescence region 100b because organic electroluminescence does not occur in the light emitting layer 123. In the non-self-luminescence region 100b, a connection recess (contact hole, not depicted) that connects the pixel electrode 119 to a source $S_1$ of a TFT is made.

The gap between the column banks 522Y adjacent to each other is defined as a gap 522z. The gaps corresponding to the self-luminescence regions 100aR, 100aG, and 100aB are defined as gaps 522zR, 522zG, and 522zB. The gap that is sandwiched by the gap 522zB and the gap 522zR and in which a lower-layer power feed auxiliary interconnect 129Y and a power feed auxiliary interconnect 128Y (hereinafter, referred to as "lower-layer auxiliary interconnect 129Y" and "auxiliary interconnect 128Y") are laid is defined as an auxiliary gap 522zA ("gap 522z" when no discrimination is made).

<Configuration of Each Part in Image Display Region 10a>

Figure 3:
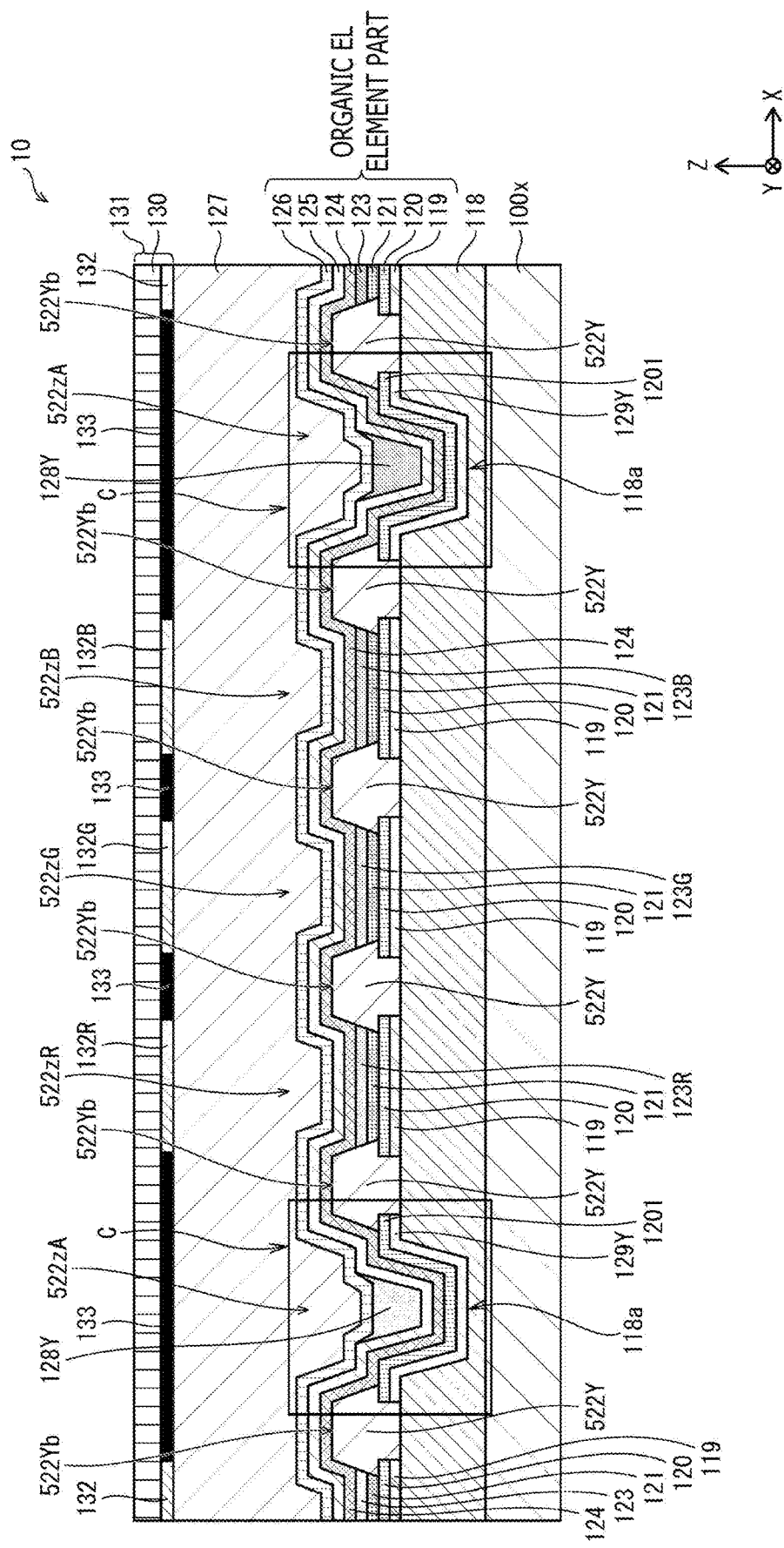
FIG. 3 is a schematic sectional view obtained by cutting along line X1-X1 in FIG. 2.

The configuration of the organic EL element 100 in the display panel 10 will be described by using FIG. 3. FIG. 3 is a schematic sectional view obtained by cutting along line X1-X1 in FIG. 2.

As depicted in FIG. 3, in the display panel 10, the substrate 100x on which thin film transistors are formed (TFT substrate) is configured on the lower side in the Z-axis direction. Over the substrate 100x, a planarization layer 118, an organic EL element part, and the front surface plate 131 are stacked. The organic EL element part includes, as the main configuration thereof, the respective layers of the planarization layer 118, the pixel electrode 119, a hole injection layer 120, a hole transport layer 121, the organic light emitting layer 123, the electron transport layer 124, the common electrode 125, and the sealing layer 126. Moreover, the banks 122 that mark out the organic EL element part are formed on the planarization layer 118.

(Substrate)

[Substrate 100x]

The substrate 100x is a support member of the display panel 10 and has a base (not depicted) and a TFT layer (not depicted) formed on the base.

The base is a support member of the display panel 10 and has a flat plate shape. As the material of the base, the base can be formed by a material having electrical insulation, for example, any of insulating materials such as alkali-free glass, soda glass, polycarbonate-based resin, polyester resin, polyimide material, and alumina.

The TFT layer is disposed for each sub-pixel on a surface of the base and a sub-pixel circuit including a thin film transistor element is formed in each TFT layer. The TFT layer is formed of a multilayer structure of electrode, semiconductor layer, insulating layer, and so forth formed over the upper surface of the base.

[Planarization Layer 118]

The planarization layer 118 is disposed over the base and on the upper surface of the TFT layer. The planarization layer 118 located on the upper surface of the substrate 100x has functions of ensuring electrical insulation between the TFT layer and the pixel electrodes 119 and planarizing a step even when the step exists in the upper surface of the TFT layer and suppressing influence on an underlying surface on which the pixel electrodes 119 are formed. As the material of the planarization layer 118, for example, any of the following materials can be used: organic insulating materials such as polyimide-based resin, acrylic resin, siloxane-based resin, and novolac phenolic resin and inorganic insulating materials such as SiO (silicon oxide) and SiN (silicon nitride). A contact hole (not depicted) for connecting the pixel electrode 119 to the source $S_1$ of the TFT of the corresponding sub-pixel circuit is opened in the planarization layer 118.

(Organic EL Element 100)
[Pixel Electrode 119]

On the planarization layer 118 located on the upper surface of the image display region 10a in the substrate 100x, the pixel electrodes 119 are disposed corresponding to the sub-pixels 100se.

The pixel electrode 119 is a component for supplying carriers to the light emitting layer 123. The pixel electrode 119 supplies holes to the light emitting layer 123 when functioning as an anode, for example. As a metal layer, the pixel electrode 119 is composed of, for example, silver (Ag), aluminum (Al), aluminum alloy, molybdenum (Mo), APC (alloy of silver, palladium, and copper), or the like as a material that has low sheet resistance and high light reflectivity. The thickness of the pixel electrode 119 may be set to at least 200 nm and at most 400 nm, for example.

The shape of the pixel electrode 119 is a flat plate shape that is a substantially rectangular shape, for example. A connecting electrode (not depicted) of the pixel electrode 119 obtained by recessing part of the pixel electrode 119 in the direction toward the substrate 100x is formed over the contact hole of the planarization layer 118. The pixel electrode 119 and an interconnect connected to the source $S_1$ of the corresponding pixel are connected at the bottom of the connection recess.

A publicly-known transparent electrically-conductive film may be further disposed on the surfaces of the pixel electrodes 119. As the material of the transparent electrically-conductive film, indium tin oxide (ITO) or indium zinc oxide (IZO) can be used, for example.

[Hole Injection Layer 120]

The hole injection layers 120 are stacked on the pixel electrodes 119. The hole injection layer 120 has a function of transporting holes injected from the pixel electrode 119 to the hole transport layer 121.

The hole injection layer 120 is a layer composed of an oxide of silver (Ag), molybdenum (Mo), chromium (Cr), vanadium (V), tungsten (W), nickel (Ni), iridium (Ir), or the like or an electrically-conductive polymer material such as PEDOT (mixture of polythiophene and polystyrene sulfonate), for example. The thickness of the hole injection layer 120 may be set to several nanometers to several tens of nanometers, for example.

[Bank 122]

Banks composed of an insulator are formed to cover edges of the pixel electrodes 119 and the hole injection layers 120. As the banks, the column banks 522Y and the row banks 122X are formed in a lattice manner. The gaps 522z marked out by the column banks 522Y are formed between the column banks 522Y. At the bottom part of each gap 522z, the plural pixel electrodes 119 are disposed in a row in the Y direction and the hole injection layer 120, the hole transport layer 121, the organic light emitting layer 123, and the electron transport layer 124 as functional layers are formed over the pixel electrodes 119. The shape of the column bank 522Y is a linear shape that extends in the column direction and a section obtained by cutting in parallel to the row direction has a forward tapered trapezoidal shape in which the upper side is tapered. The column bank 522Y functions also a structure that dams up the flow of ink containing an organic compound serving as the material of the light emitting layer 123 in the row direction and prevents the applied ink from overflowing when the light emitting layer 123 is formed by a wet method. Furthermore, the column bank 522Y defines the outer edge of the luminescence region 100a of each sub-pixel 100se in the row direction by the base part in the row direction.

The row banks 122X are formed between the pixel electrodes 119 adjacent in the Y direction in each gap 522z and mark out the sub-pixels 100se adjacent in the Y direction. Thus, openings corresponding to the self-luminescence regions 100a are formed by the row banks 122X and the column banks 522Y. The shape of the row bank 122X is a linear shape that extends in the row direction and a section obtained by cutting in parallel to the column direction has a forward tapered trapezoidal shape in which the upper side is tapered. The row banks 122X each have an upper surface at a position lower than upper surfaces 522Yb of the column banks 522Y.

The banks 122 are composed of an insulating organic material (for example, acrylic resin, polyimide-based resin, and novolac phenolic resin) or an inorganic material such as silicon oxide (SiO), silicon nitride (SiN), or silicon oxynitride (SiON).

[Hole Transport Layer 121]

The hole transport layers 121 are stacked on the hole injection layers 120 in the gaps 522zR, 522zG, and 522zB. The hole transport layer 121 has a function of transporting holes injected from the hole injection layer 120 to the light emitting layer 123. For the hole transport layer 121, polyfluorene or a derivative thereof or a polymer compound such as polyallylamine, which is an amine-based organic polymer, or a derivative thereof or TFB (poly(9,9-di-n-octylfluorene)-alt-(1,4-phenylene-((4-sec-butylphenyl)imino)-1,4-phenylene)) or the like can be used, for example.

[Light Emitting Layer 123]

The light emitting layers 123 are stacked on the hole transport layers 121. The light emitting layer 123 is a layer composed of an organic compound and has a function of emitting light through generation of an excited state due to injection and recombination of holes and electrons inside the light emitting layer 123. The light emitting layers 123 are disposed in a linear manner to extend in the column direction in the gaps 522zR, the gaps 522zG, and the gaps 522zB defined by the column banks 522Y. Light emitting layers 123R, 123G, and 123B that emit light of the respective colors are formed in the red gap 522zR, the green gap 522zG, and the blue gap 522zB.

In the display panel 10, a luminescent organic material that can be deposited by using a wet printing method is used as the material of the light emitting layer 123. Specifically, for example, it is preferable for the light emitting layer 123 to be formed of any of the following fluorescent substances described in a patent publication (Japanese Patent Laid-Open No. Hei 5-163488): oxynoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metal, oxine metal complexes, and rare earth complexes.

[Electron Transport Layer 124]

The electron transport layer 124 is formed to be stacked to cover the upper surfaces of the light emitting layers 123 in the gaps 522z defined by the column banks 522Y. The electron transport layer 124 has a function of transporting electrons from the common electrode 125 to the light emitting layer 123 and limits injection of electrons into the light emitting layer 123. In the display panel 10, the electron transport layer 124 is formed in the state of being continuous at least over the whole of the display region.

As organic materials that are used for the electron transport layer 124 and have high electron transport performance, n-electron low-molecular organic materials such as oxadiazole derivative (OXD), triazole derivative (TAZ), and phenanthroline derivative (BCP, Bphen) are cited, for example. The electron transport layer 124 may contain a layer formed of sodium fluoride. Furthermore, the electron transport layer 124 may contain a layer formed through being doped with a doping metal selected from alkali metals or alkaline earth metals.

[Common Electrode 125]

The common electrode 125 is formed on the electron transport layer 124. The common electrode 125 makes an energization path by making a pair with the pixel electrode 119 to sandwich the light emitting layer 123. The common electrode 125 supplies carriers to the light emitting layer 123, and supplies electrons to the light emitting layer 123 when functioning as a cathode, for example. In the display panel 10, the common electrode 125 is an electrode common to the respective light emitting layers 123. The common electrode 125 is formed by using an electrode obtained by turning silver (Ag), aluminum (Al), or the like into a thin film. Furthermore, an electrically-conductive material having light transmissivity, such as indium tin oxide (ITO) or indium zinc oxide (IZO), may be used in addition to the metal layer or alone.

(Sealing Layer 126)

The sealing layer 126 is formed to be stacked to cover the common electrode 125. The sealing layer 126 is a component for suppressing the occurrence of the situation in which the pixel electrodes 119, the lower-layer auxiliary interconnects 129Y, the hole injection layers 120, the hole transport layers 121, the light emitting layers 123, the electron transport layer 124, the common electrode 125, the auxiliary interconnects 128Y, and a metal oxide layer 1201 get contact with water, air, or the like to deteriorate. The sealing layer 126 is disposed to cover the upper surface of the common electrode 125. Furthermore, in the case of the top-emission type, the sealing layer 126 is formed by using a translucent inorganic material such as silicon nitride (SiN) or silicon oxynitride (SiON), for example, having high translucency in order to ensure favorable light extraction property as a display. Moreover, a sealing resin layer composed of a resin material such as acrylic resin or silicone resin may be disposed on the layer of the translucent inorganic material.

(Forming Part of Auxiliary Interconnect 128Y)

The forming part of the auxiliary interconnect 128Y depicted in parts C in FIG. 3 will be described below.

[Recessed Part 118a of Planarization Layer 118]

Recessed parts 118a that extend in the column direction and have an elongated shape are opened in at least one gap in the gaps between the pixel electrodes adjacent to each other in the row direction on the planarization layer 118. In the present example, with respect to the unit pixel 100e including three sub-pixels 100se corresponding to the self-luminescence regions 100aR, 100aG, and 100aB lined up in the row direction, the recessed parts 118a are opened in the gaps between the unit pixels 100e in the row direction. In the present example, the thickness of the planarization layer is approximately 4 μm, for example. The width of the recessed part 118a is approximately 15 μm, for example, and the depth thereof is approximately 3 μm, for example. The planarization layer 118 has a remaining part of approximately 1 μm at the bottom part. However, the depth and width of the recessed part 118a are not limited to the above and the recessed part 118a may be formed with appropriate adjustment in matching with the necessary film thickness of the auxiliary interconnect 128Y formed inside. For example, the depth of the recessed part 118a may be set to at least 2 μm and at most 5 μm.

Furthermore, a configuration is employed in which two elongated-shaped column banks 522Y are formed to extend in the column direction between the recessed part 118a of the planarization layer 118 and the pixel electrodes 119 each adjacent to the recessed part 118a on both sides in the row direction and the depth of the recessed part 118a is larger than the height of the column banks 522Y. Here, the gap between the two elongated-shaped column banks 522Y that sandwich the recessed part 118a of the planarization layer 118 is defined as the auxiliary gap 522zA.

The lower-layer auxiliary interconnects 129Y formed of vapor-deposited films that extend in the column direction are disposed on the planarization layer 118 located in the recessed parts 118a of the planarization layer 118. A configuration may be employed in which the metal oxide layers 1201 patterned into the same shape as the lower-layer auxiliary interconnects 129Y are further stacked on the lower-layer auxiliary interconnects 129Y. Here, that the lower-layer auxiliary interconnects 129Y are formed of vapor-deposited films means that the lower-layer auxiliary interconnects 129Y are deposited by using a dry deposition process such as a vacuum evaporation method, electron-beam evaporation method, sputtering method, reactive sputtering method, ion plating method, or gas-phase growth method.

The lower-layer auxiliary interconnects 129Y are disposed to extend in the column direction on the planarization layer 118 in the auxiliary gaps 522zA between the column banks 522Y. The lower-layer auxiliary interconnects 129Y are auxiliary interconnect layers for reducing the electrical resistance of the common electrode 125 by intending electrical connection to the common electrode 125 stacked over the upper surfaces of the metal oxide layers 1201 stacked on the upper surfaces of the lower-layer auxiliary interconnects 129Y. It is preferable for the lower-layer auxiliary interconnects 129Y to be formed of metal layers or alloy layers containing, for example, aluminum (Al) as the main component as a material with low sheet resistance. The thickness may be set to at least 200 nm and at most 400 nm, for example. The lower-layer auxiliary interconnects 129Y may be formed by the same material and at the same layer level as the pixel electrodes 119. Furthermore, the metal oxide layers 1201 may be formed by the same material and at the same layer level as the hole injection layers 120.

By disposing the lower-layer auxiliary interconnect 129Y and the metal oxide layer 1201 (hereinafter, referred to as "lower-layer auxiliary interconnect 129Y and so forth") in the recessed part 118a as above, the section of the column bank 522Y adjacent to the recessed part 118a in the row direction has an equivalent shape in the row direction. If the lower-layer auxiliary interconnect 129Y and so forth are not disposed, the sectional shape of the column bank 522Y adjacent to the recessed part 118a in the row direction becomes a shape in which the height of the side closer to the recessed part 118a is lower by the thickness of the lower-layer auxiliary interconnect 129Y and so forth. In this case, when ink containing many interconnect materials is applied into the gap 522zA in a forming step of the auxiliary interconnect 128Y to be described later, the possibility that the ink spills over into the adjacent gap 522z and blocks the light emitting layer 123 in the gap 522z increases.

Therefore, by disposing the lower-layer auxiliary interconnect 129Y and so forth in the recessed part 118a, blocking of the light emitting layer 123 in association with spilling of ink to the adjacent gap 522z can be deterred.

The common electrode 125 is formed of a vapor-deposited film and is continuously disposed above the lower-layer auxiliary interconnects 129Y in the recessed parts 118a of the planarization layer 118. Furthermore, the common electrode 125 is electrically connected to the lower-layer auxiliary interconnects 129Y through the metal oxide layers 1201. Here, that the common electrode 125 is formed of a vapor-deposited film means that the common electrode 125 is deposited by using a dry deposition process such as a vacuum evaporation method, electron-beam evaporation method, sputtering method, reactive sputtering method, ion plating method, or gas-phase growth method.

The electron transport layer 124 may be continuously disposed between the lower-layer auxiliary interconnects 129Y and the common electrode 125 in the recessed parts 118a of the planarization layer 118. In this case, the common electrode 125 is electrically connected to the lower-layer auxiliary interconnects 129Y through the metal oxide layers 1201 and the electron transport layer 124.

[Auxiliary Interconnect 128Y]

The auxiliary interconnects 128Y formed of applied films that extend in the column direction are disposed on the upper surface of the common electrode 125 located in the recessed parts 118a of the planarization layer 118. The auxiliary interconnects 128Y are what is called bus bars that are auxiliary interconnect layers for reducing the electrical resistance of the common electrode 125 by intending electrical connection to the common electrode 125 as an underlying layer. It is preferable for the auxiliary interconnects 128Y to be formed of metal layers or alloy layers containing, for example, silver (Ag) or aluminum (Al) as the main component as a material with low sheet resistance. Here, that the auxiliary interconnects 128Y are formed of applied films means that the auxiliary interconnects 128Y are formed by applying ink containing a solute by using a wet deposition process such as a printing method, spin coating method, or inkjet method.

In this mode, the auxiliary interconnects 128Y formed in the recessed parts 118a are extended to the peripheral edge of the substrate 100x and are connected to an external connection terminal in the state of ensuring a sectional area equivalent to the sectional area of the recessed part 118a by having a predetermined thickness. For example, the thickness of the auxiliary interconnect 128Y may be set to at least 0.5 μm and at most 2 μm. Thus, reduction in the resistance of the power feed path from the external connection terminal to the organic EL element array 100ar can be intended.

(Joining Layer 127)

The front surface plate 131 in which color filter layers 132 are formed on the main surface of an upper substrate 130 on the lower side is disposed above the sealing layer 126 and is joined by a joining layer 127. The joining layer 127 has a function of sticking the substrate 100x and the front surface plate 131 to each other and preventing each layer from being exposed to water and air. The material of the joining layer 127 is composed of a resin adhesive or the like, for example, and a translucent resin material such as an acrylic resin, silicone resin, or epoxy resin can be employed.

(Configuration of Each Part of Front Surface Plate 131)

[Upper Substrate 130]

The front surface plate 131 in which the color filter layers 132 are formed on the upper substrate 130 is set and joined on the joining layer 127. For the upper substrate 130, an optical transmissive material such as a cover glass or transparent resin film, for example, is used in the top-emission type. Furthermore, improvement in the rigidity of the display panel 10, prevention of entry of water, air, etc., and so forth can be intended by the upper substrate 130.

[Color Filter Layer 132]

On the upper substrate 130, the color filter layers 132 are formed at positions corresponding to the self-luminescence regions 100a of the respective colors of the pixels. The color filter layers 132 are transparent layers disposed to cause visible light with wavelengths corresponding to R, G, and B to be transmitted, and have a function of causing light emitted from the pixels of the respective colors to be transmitted and correcting the chromaticity thereof. For example, in the present example, color filter layers 132R, 132G, and 132B of red, green, and blue are formed above the luminescence region 100aR in the red gap 522zR, the luminescence region 100aG in the green gap 522zG, and the luminescence region 100aB in the blue gap 522zB, respectively. As the color filter layers 132, a publicly-known resin material (for example, color resist made by JSR Corporation as a commercially-available product) or the like can be employed.

[Light Blocking Layer 133]

On the upper substrate 130, light blocking layers 133 are formed at positions corresponding to the boundaries between the luminescence regions 100a of the respective pixels. The light blocking layers 133 are black resin layers disposed for preventing visible light with wavelengths corresponding to R, G, and B from being transmitted and are composed of a resin material containing black pigments excellent in light absorption performance and light blocking performance, for example. For example, the light blocking layers 133 are composed of a resin material that contains an ultraviolet-curable resin (for example, ultraviolet-curable acrylic resin) material as the main component and is obtained by adding, to it, black pigments of a light blocking material, such as carbon black pigments, titanium black pigments, metal oxide pigments, or organic pigments, for example.

<Configuration of Peripheral Region 10b of Display Panel 10>

Figure 4A:
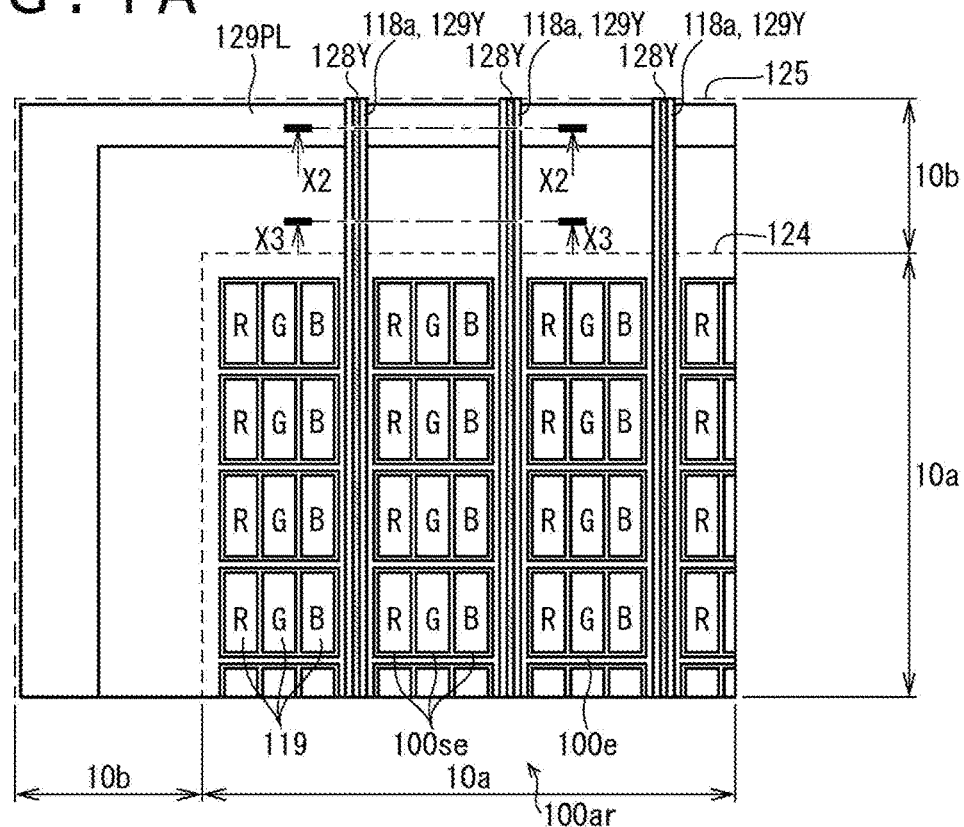
FIG. 4A is a schematic plan view of part B in FIG. 1
Figure 5A:
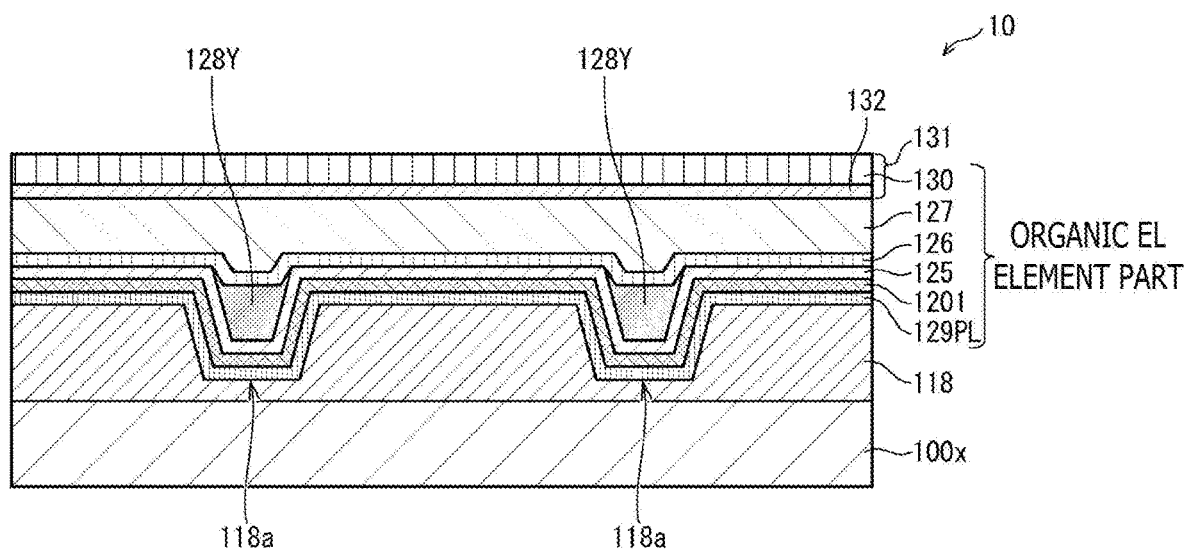
FIG. 5A is a schematic sectional view obtained by cutting along line X2-X2 in FIG. 4A
Figure 5B:
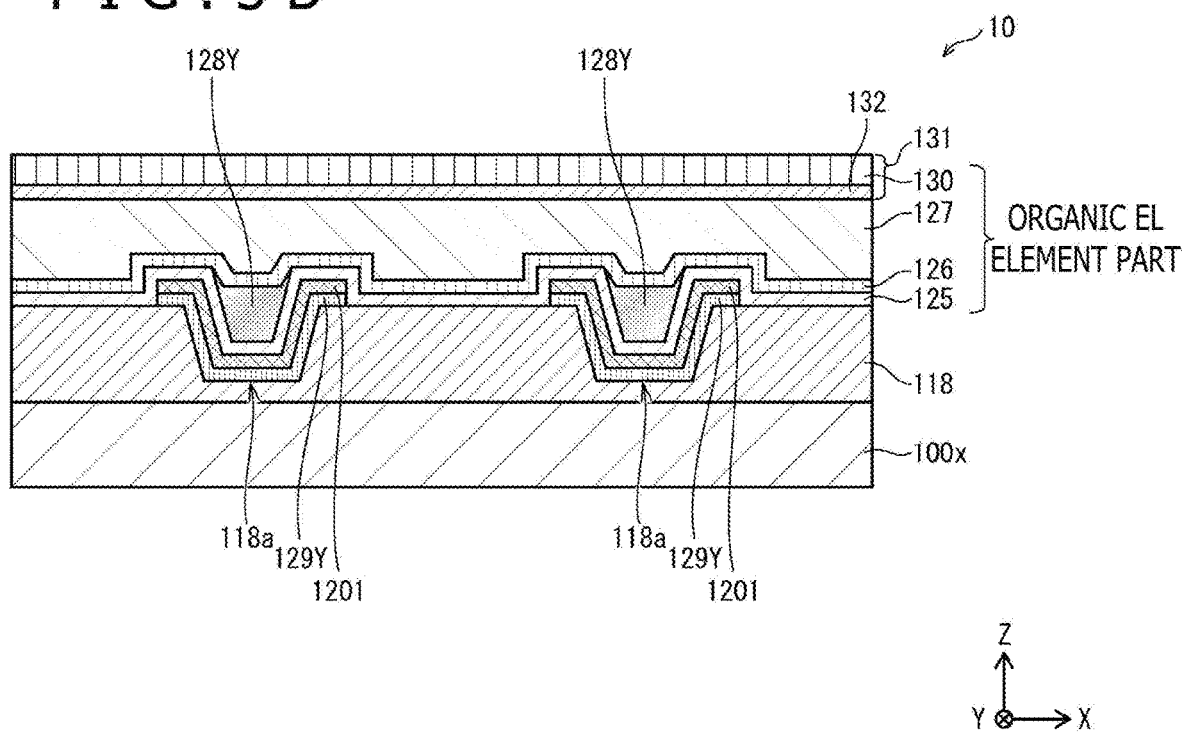
FIG. 5B is a schematic sectional view obtained by cutting along line X3-X3 in FIG. 4A.

FIG. 4A is a schematic plan view of part B in FIG. 1 in one mode of the embodiment. FIG. 4A is a schematic plan view depicting a part in the image display region 10a and the peripheral region 10b and is a diagram depicting the state in which the banks 122, the light emitting layers 123, the electron transport layer 124, the common electrode 125, the sealing layer 126, and the front surface plate 131 are removed. FIG. 5A is a schematic sectional view obtained by cutting along line X2-X2 in FIG. 4A. FIG. 5B is a schematic sectional view obtained by cutting along line X3-X3 in FIG. 4A.

As depicted in FIG. 4A, the lower-layer auxiliary interconnects 129Y and the auxiliary interconnects 128Y extend in the column direction in such a manner as to be adjacent to the unit pixels 100e in the row direction.

In the peripheral region 10b of the display panel 10, an electrode plate 129PL that extends outside the image display region 10a in which the organic EL element array 100ar exists in plan view is disposed on the planarization layer 118. A configuration may be employed in which the metal oxide layer 1201 patterned into the same shape as the electrode plate 129PL is further stacked on the electrode plate 129PL. The electrode plate 129PL is continuously disposed to the vicinity of the outer edge of the peripheral region 10b of the substrate 100x and is connected to the external connection terminal. The electrode plate 129PL is disposed in a strip manner with a predetermined width along the peripheral edge of the substrate 100x, which can reduce the electrical resistance of the common electrode 125 in the display panel 10.

It is preferable for the electrode plate 129PL to be formed of a metal layer or alloy layer containing, for example, aluminum (Al) as the main component as a material with low sheet resistance. Furthermore, the electrode plate 129PL may be formed by the same material and at the same layer level as the lower-layer auxiliary interconnects 129Y and the pixel electrodes 119. Moreover, the metal oxide layer 1201 may be formed by the same material and at the same layer level as the hole injection layers 120.

The common electrode 125 continuously extends to the vicinity of the peripheral edge of the substrate 100x in plan view.

A configuration may be employed in which the electron transport layer 124 extends to the outside of the image display region 10a in which the organic EL element array 100ar exists in plan view.

As depicted in FIG. 4A, in one mode of the embodiment, the recessed parts 118a of the planarization layer 118 are opened to the vicinity of the peripheral edge of the substrate 100x in plan view.

Furthermore, as depicted in FIG. 5A, the electrode plate 129PL is continuously disposed in the recessed parts 118a of the planarization layer 118 at the peripheral edge of the substrate 100x.

The auxiliary interconnects 128Y are extended to the vicinity of the peripheral edge of the substrate 100x in plan view in the recessed parts 118a of the planarization layer 118. Furthermore, the auxiliary interconnects 128Y extend to the upper surface of the electrode plate 129PL in plan view, and the auxiliary interconnects 128Y are electrically connected to the electrode plate 129PL.

Moreover, as depicted in FIG. 5B, a configuration may be employed in which the lower-layer auxiliary interconnects 129Y are also formed to extend to the vicinity of the peripheral edge of the substrate 100x in plan view in the recessed parts 118a of the planarization layer 118 and are connected to the electrode plate 129PL.

In this mode, the auxiliary interconnects 128Y formed in the recessed parts 118a are connected to the electrode plate 129PL existing at the peripheral edge of the substrate 100x and are connected to the external connection terminal in the state of ensuring a sectional area equivalent to the sectional area of the recessed part 118a by having a predetermined thickness. Thus, reduction in the resistance of the power feed path from the electrode plate 129PL to the organic EL element array 100ar can be intended.

Figure 4B:
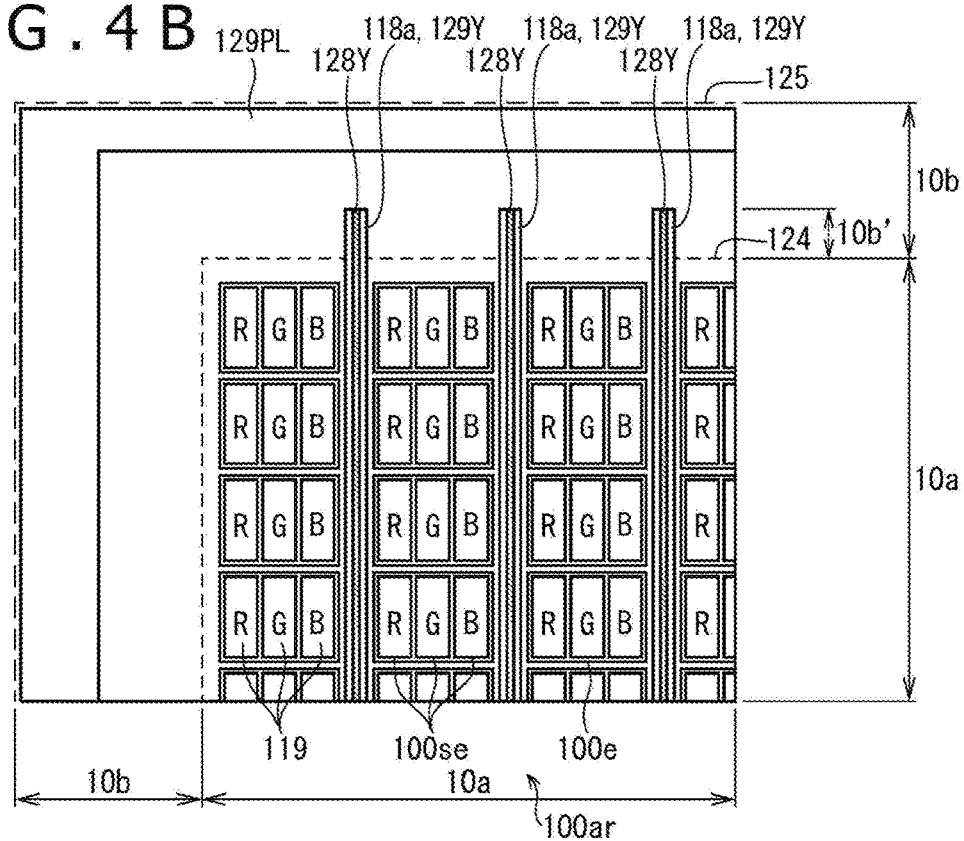
FIG. 4B is a schematic plan view of another mode of part B in FIG. 1.

FIG. 4B is a schematic plan view of another mode of part B in FIG. 1 in another mode of the embodiment. In the mode depicted in FIG. 4B, the recessed parts 118a of the planarization layer 118 are opened to the positions separated from the inner edge of the peripheral region 10b of the substrate 100x toward the outside by a predetermined distance 10b' in plan view. Furthermore, the auxiliary interconnects 128Y and the lower-layer auxiliary interconnects 129Y also extend to the same positions as the recessed parts 118a in the recessed parts 118a of the planarization layer 118, and only the common electrode 125 continuously extends to the vicinity of the peripheral edge of the substrate 100x in the peripheral region 10b of the substrate 100x.

In this mode, the auxiliary interconnects 128Y are electrically connected to the electrode plate 129PL through the common electrode 125 in the peripheral region 10b and reduction in the resistance of the power feed path from the electrode plate 129PL to the organic EL element array 100ar can be intended.

<Manufacturing Method of Display Panel 10>

Figure 6:
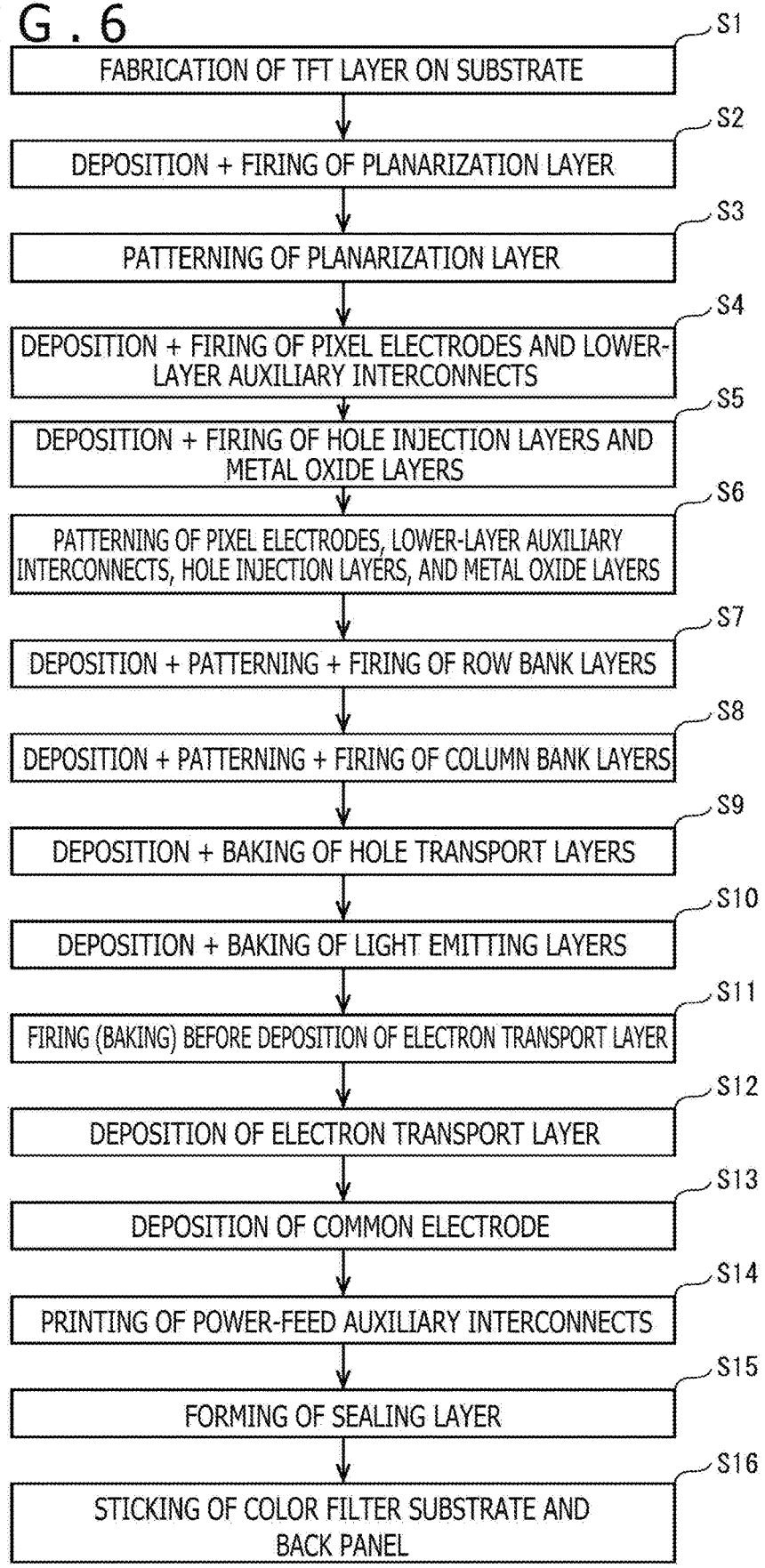
FIG. 6 is a flowchart of manufacturing steps of the organic EL display panel.

A manufacturing method of the display panel 10 will be described by using FIGS. 6 to 10. FIG. 6 is a flowchart of manufacturing steps of the organic EL display panel 10. The respective diagrams in FIGS. 7 to 10 are schematic sectional views that depict the state in the respective steps in the manufacturing of the display panel 10 and are obtained by cutting at the same position as line X1-X1 in FIG. 2 (image display region 10a).

[Fabrication of Substrate 100x]

Figure 7A:
FIGS. 7A to 7E are schematic sectional views that depict the state in the respective steps in manufacturing of the organic EL display panel and are obtained by cutting at the same position as line X1-X1 in FIG. 2.

Plural TFTs and interconnects (TFT layer) are formed on the substrate 100x (step S1 in FIG. 6, FIG. 7A).

[Forming of Planarization Layer 118]

The planarization layer 118 is formed to cover the substrate 100x.

At the time, the recessed parts 118a that extend in the column direction and have an elongated shape are formed in the planarization layer 118 by a photolithography method. In the row direction, the recessed parts 118a are formed between the forming regions of the unit pixels 100e adjacent to each other in the row direction in the present example. Here, as described above, the depth of the recessed part 118a of the planarization layer 118 may be set to at least 2 µm and at most 5 µm. In the present example, the thickness of the planarization layer is approximately 4 µm, for example. The width of the recessed part 118a is approximately 15 µm, for example, and the depth thereof is approximately 3 µm, for example. The planarization layer 118 has a remaining part of approximately 1 µm at the bottom part.

Furthermore, contact holes (not depicted) are formed at places above, e.g., source electrodes of TFT elements in the planarization layer 118 simultaneously with the recessed parts 118a. The contact holes are formed by using patterning and so forth in such a manner that the surface of the source electrode is exposed at the bottom part of the contact hole.

Figure 7B:
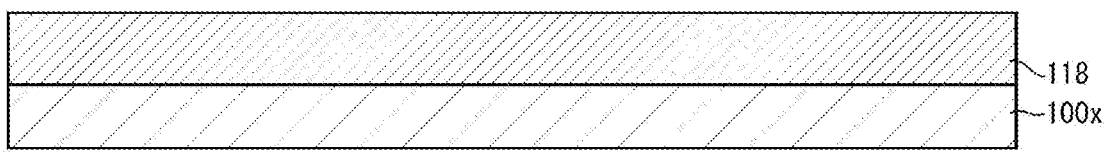

In the forming of the planarization layer 118, first the constituent material of the planarization layer 118 (photosensitive resin material) is applied as photoresist and the surface is planarized to thereby form the planarization layer 118 (FIG. 6: step S2, FIG. 7B). Specifically, a resin material having certain liquidity is applied along the upper surface of the substrate 100x by, e.g., a die coating method in such a manner as to bury recess and projection on the substrate 100x due to the TFT layer and is fired to form a resin film. As the resin material, a solution obtained by dissolving an acrylic resin, polyimide-based resin, siloxane-based resin, or phenolic resin that is a positive photosensitive material in a solvent is used, for example. The resin film is formed by evenly applying this solution by using a spin coating method or the like.

Figure 7C:
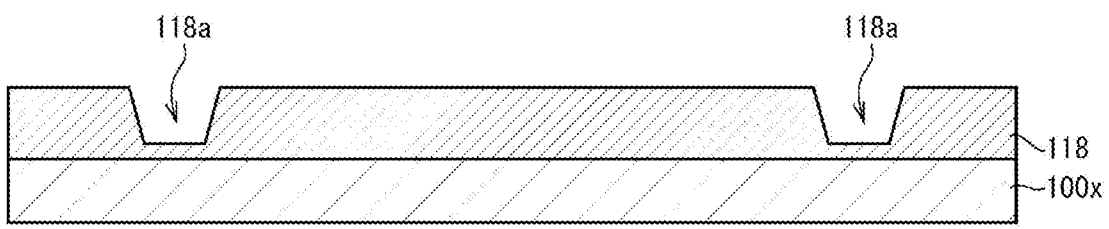

Next, patterning of the resin film is carried out to simultaneously form the planarization layer 118 having the recessed parts 118a and the contact holes by photolithography using a photomask including halftone parts (FIG. 6: step S3, FIG. 7C). In the photomask used, the parts corresponding to the contact holes may be translucent parts and the parts corresponding to the recessed parts 118a may be the halftone parts and the other region may be a light blocking part. The recessed parts 118a are formed through patterning with the bottom part left by carrying out exposure using the halftone parts of the mask and then removing the exposed parts by developing and carrying out firing. Furthermore, the contact holes are formed through patterning in such a manner that the surface of a source electrode is exposed at the bottom part by carrying out exposure using the translucent parts of the mask and then removing the exposed parts by developing and carrying out firing. Regarding the section of the formed recessed parts 118a, the section obtained by cutting in parallel to the row direction has a reverse tapered trapezoidal shape in which the lower side is tapered as depicted in FIG. 7C.

Thereafter, connection electrodes (not depicted) are formed in the contact holes.

[Forming of Pixel Electrode 119, Lower-Layer Auxiliary Interconnect 129Y, Electrode Plate 129PL, Hole Injection Layer 120, and Metal Oxide Layer 1201]

Next, forming of the pixel electrodes 119 and the hole injection layers 120 is carried out.

First, after the planarization layer 118 is formed, dry etching treatment is carried out for the surface of the planarization layer 118 to carry out cleaning before film deposition.

Figure 7D:
Figure 7E:
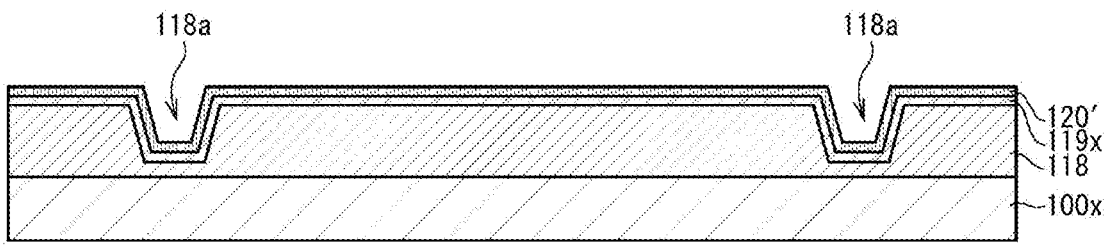

Next, after the cleaning before film deposition is carried out for the surface of the planarization layer 118, a metal film 119x for the pixel electrode for forming the pixel electrodes 119 and the lower-layer auxiliary interconnects 129Y in the image display region 10a and a metal film for forming the electrode plate 129PL in the peripheral region 10b are deposited on the surface of the planarization layer 118 by a gas-phase growth method such as a sputtering method or vacuum evaporation method (FIG. 6: step S4, FIG. 7D). In the present example, a film composed of aluminum or an alloy containing aluminum as the main component is deposited by a sputtering method. Firing may be carried out after the film deposition.

Moreover, after cleaning before film deposition is carried out for the surface of the metal film 119x, continuously under the vacuum atmosphere, a metal film 120' for the hole injection layer 120 for forming the hole injection layers 120 and the metal oxide layers 1201 in the image display region 10a and a metal film for forming the metal oxide layer 1201 in the peripheral region 10b are deposited on the surface of the metal film 119x by a gas-phase growth method (FIG. 6: step S5, FIG. 7D). In the present example, tungsten is deposited by a sputtering method. Firing may be carried out after the film deposition.

Figure 8A:
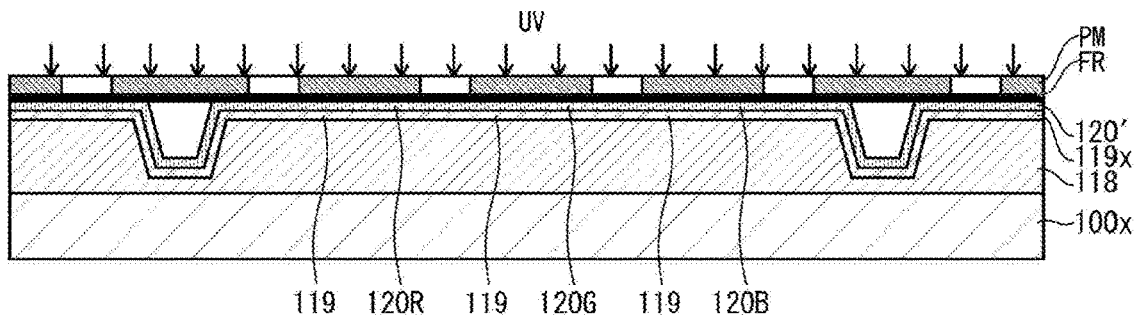
FIGS. 8A to 8D are schematic sectional views that depict the state in the respective steps in the manufacturing of the organic EL display panel and are obtained by cutting at the same position as line X1-X1 in FIG. 2.

Thereafter, a photoresist layer FR composed of a photosensitive resin or the like is applied. Thereafter, a photomask PM in which predetermined opening parts are made is placed. Then, ultraviolet irradiation is carried out from above it and the photoresist is exposed to transfer the pattern which the photomask has to the photoresist (FIG. 8A). Next, the photoresist layer FR is subjected to patterning by developing.

Thereafter, through the patterned photoresist layer FR, in the image display region 10a, dry etching treatment is carried out for the metal film 120' and patterning is carried out to form the hole injection layers 120 and the metal oxide layers 1201. Furthermore, in the peripheral region 10b, dry etching treatment is carried out for the metal film and patterning is carried out to form the metal oxide layer 1201.

Subsequently, through the patterned photoresist layer FR and hole injection layers 120, in the image display region 10a, wet etching treatment is carried out for the metal film 119x and patterning is carried out to form the pixel electrodes 119 and the lower-layer auxiliary interconnects 129Y. Furthermore, in the peripheral region 10b, wet etching treatment is carried out for the metal film and patterning is carried out to form the electrode plate 129PL.

Figure 8B:
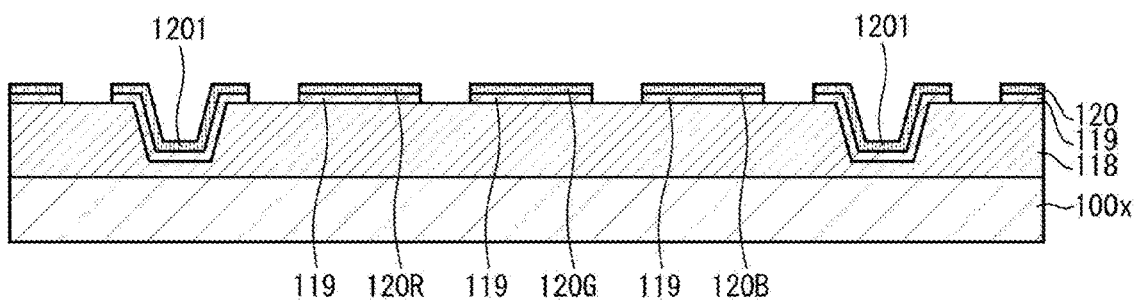

At last, the photoresist layer FR is separated. As a result, in the image display region 10a, layer-stacked bodies of the pixel electrode 119 and the hole injection layer 120 patterned into the same shape and layer-stacked bodies of the lower-layer auxiliary interconnect 129Y and the metal oxide layer 1201 are formed. Furthermore, in the peripheral region 10b, a layer-stacked body of the electrode plate 129PL and the metal oxide layer 1201 patterned into the same shape is formed (FIG. 6: step S6, FIG. 8B).

[Forming of Banks 122]

Figure 8C:
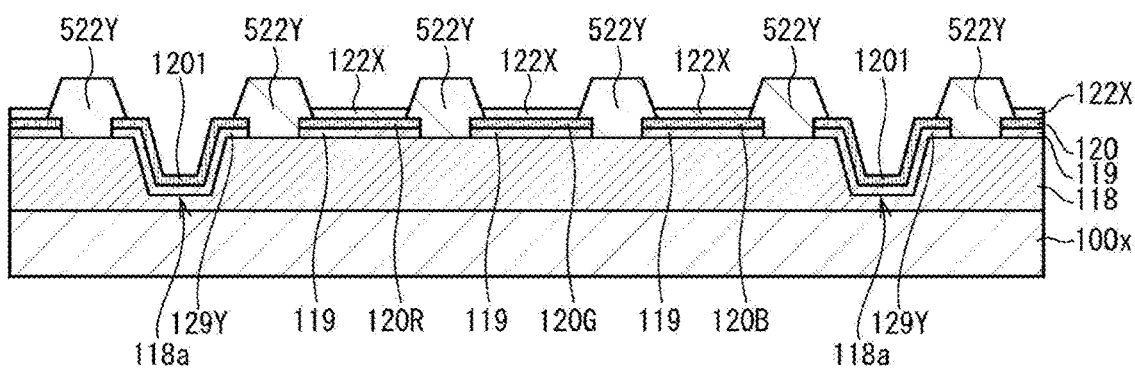

In the image display region 10a, after the hole injection layers 120 are formed, the banks 122 are formed to cover the hole injection layers 120. In the forming of the banks 122, first a film composed of the constituent material of the banks 122X (for example, photosensitive resin material) is formed to be stacked on the hole injection layers 120 by using a spin coating method or the like. Then, patterning of the resin film is carried out to form the row banks 122X (FIG. 6: step S7, FIG. 8C).

Next, in a forming step of the column banks 522Y, a film composed of the constituent material of the column banks 522Y (for example, photosensitive resin material) is formed to be stacked on the hole injection layers 120 and the row banks 122X by using a spin coating method or the like. Then, a mask is disposed above the resin film and exposure is carried out and thereafter developing is carried out. Thereby, patterning of the resin film is carried out to open the gaps 522z and form the column banks 522Y (FIG. 6: step S8, FIG. 8C). At this time, in a firing step for the row banks 122X and the column banks 522Y, the metal is oxidized and the hole injection layers 120 are completed.

[Forming of Organic Functional Layers]

The hole transport layers 121 and the light emitting layers 123 are sequentially formed to be stacked over the hole injection layers 120 formed in the gaps 522z defined by the column banks 522Y including on the row banks 122X.

Figure 8D:
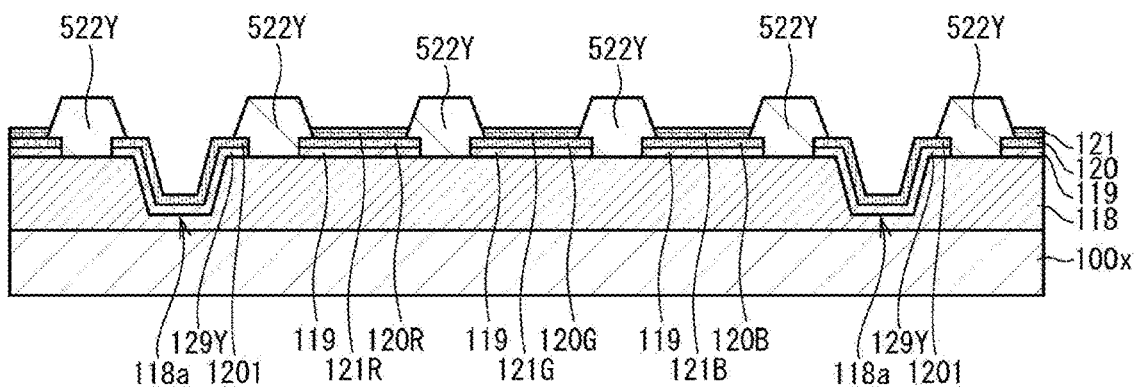

The hole transport layers 121 are made by applying ink containing constituent materials into the gaps 522z defined by the column banks 522Y by using a wet process based on an inkjet method or gravure printing method and thereafter removing the solvent by volatilization or carrying out firing (FIG. 6: step S9, FIG. 8D). The hole transport layers 121 formed in the respective sub-pixels of RGB may be formed with the film thickness being different for each sub-pixel of RGB.

Figure 9A:
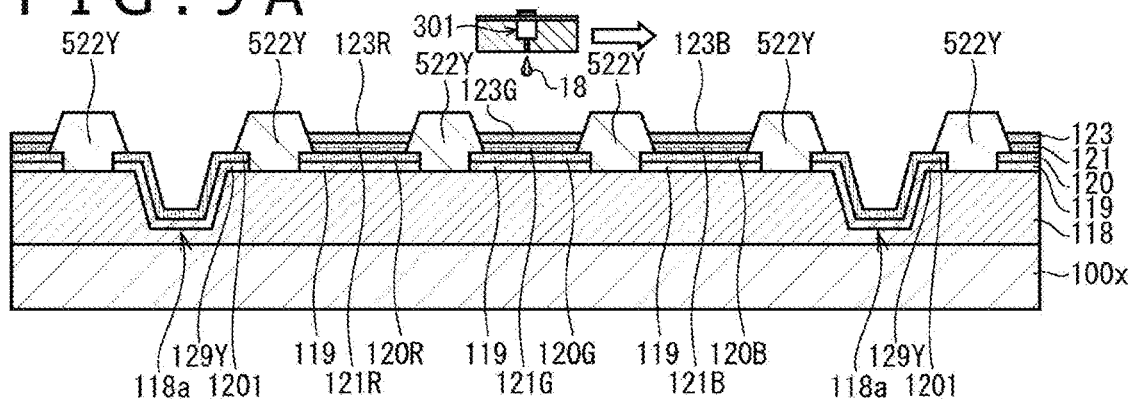
FIGS. 9A to 9D are schematic sectional views that depict the state in the respective steps in the manufacturing of the organic EL display panel and are obtained by cutting at the same position as line X1-X1 in FIG. 2.

The light emitting layers 123 are formed by applying ink containing constituent materials into the gaps 522z defined by the column banks 522Y by using an inkjet method and thereafter carrying out firing (FIG. 6: step S10, FIG. 9A).

Specifically, the substrate 100x is placed on an operation table of a droplet discharging apparatus in the state in which the column banks 522Y are along the Y direction. Then, while an inkjet head 301 in which plural nozzle holes are disposed in a line manner along the Y direction is moved relative to the substrate 100x in the X direction, droplets of ink 18 are made to land from each nozzle hole with an aim at landing targets set in the gaps 522z between the column banks 522Y. In this step, the gaps 522z that become sub-pixel forming regions are each filled with the ink 18 containing the material of the organic luminescence layer of any of R, G, and B by the inkjet method and the supplied ink is dried under a reduced pressure and baking treatment is carried out. Thereby, the light emitting layers 123R, 123G, and 123B are formed.

After the application of the ink for forming any of the red, green, and blue luminescence layers for the substrate 100x ends, steps of applying ink of another color to this substrate and subsequently applying ink of the third color to the substrate are repeatedly carried out, so that the ink of the three colors is sequentially applied. Thereby, over the substrate 100x, the red luminescence layers, the green luminescence layers, and the blue luminescence layers are formed to be repeatedly lined up in the lateral direction of the plane of paper of the diagram.

The forming method of the hole transport layers 121 and the light emitting layers 123 over the hole injection layers 120 is not limited to the above-described method and ink may be dropped and applied by a publicly-known method such as a dispenser method, nozzle coating method, spin coating method, intaglio printing, or relief printing, for example.

Before the hole transport layers 121 are formed, ink containing an electrically-conductive polymer material such as PEDOT (mixture of polythiophene and polystyrene sulfonate) may be applied into the gaps 522z by using an inkjet method, and thereafter the solvent may be removed by volatilization or firing may be carried out.

[Firing Before Deposition of Electron Transport Layer]

Baking before deposition of the electron transport layer is carried out under a vacuum environment (FIG. 6: step S11). This can deter the planarization layer from absorbing water again after remaining water in the planarization layer is removed.

[Forming of Electron Transport Layer 124]

Figure 9B:
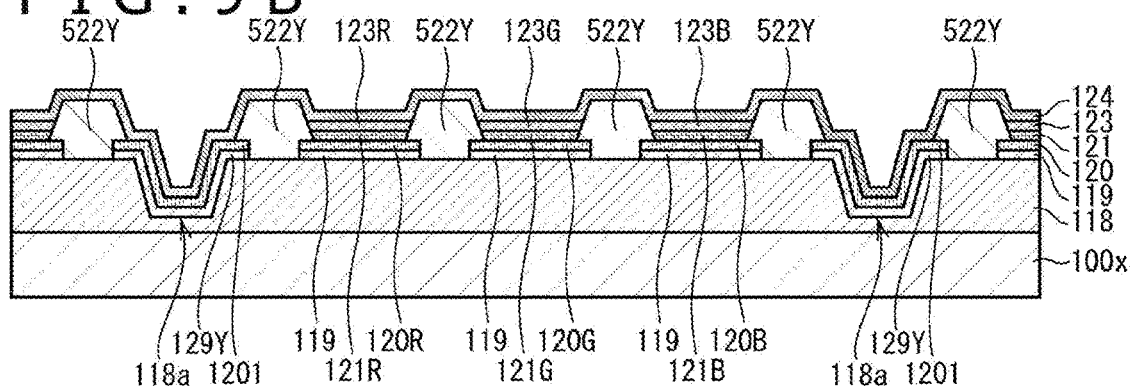

After the light emitting layers 123 are formed, the electron transport layer 124 is formed over the whole surface of the luminescence area (image display region 10a and part of the peripheral region 10b) of the display panel 10 by a vacuum evaporation method or the like (FIG. 6: step S12, FIG. 9B).

The reason why the vacuum evaporation method is used is because no damage is given to the light emitting layers 123 that are organic films. As the electron transport layer 124, a metal oxide or fluoride is deposited on the light emitting layers 123 by the vacuum evaporation method or the like. Alternatively, the electron transport layer 124 is deposited by a co-evaporation method with an organic material and a metal material. The film thickness of the electron transport layer 124 is set to an appropriate film thickness that is the most advantageous for optical light extraction.

[Forming of Common Electrode 125]

Figure 9C:
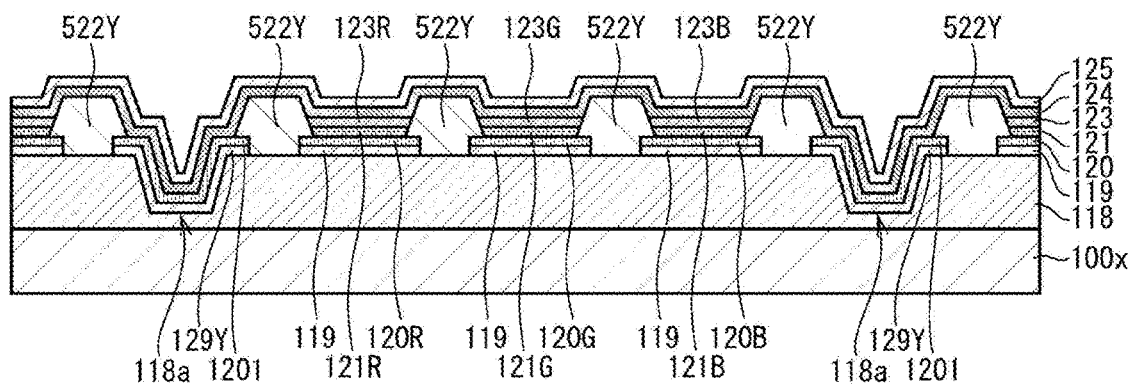

After the electron transport layer 124 is formed, the common electrode 125 is formed to cover the electron transport layer 124 in the image display region 10a and simultaneously cover the electrode plate 129PL in the peripheral region 10b (FIG. 6: step S13, FIG. 9C). As the common electrode 125, a film composed mainly of a metal or metal oxide is formed to cover the underlying layer by a sputtering method or vacuum evaporation method.

At this time, because the upper surface of the lower-layer auxiliary interconnect 129Y is set to a forward tapered shape oriented upward in the recessed part 118a of the planarization layer 118, the common electrode 125 is disposed continuously with the upper surface of the lower-layer auxiliary interconnect 129Y or the metal oxide layer 1201 inside the recessed part 118a of the planarization layer 118.

[Forming of Auxiliary Interconnect 128Y]

Figure 9D:
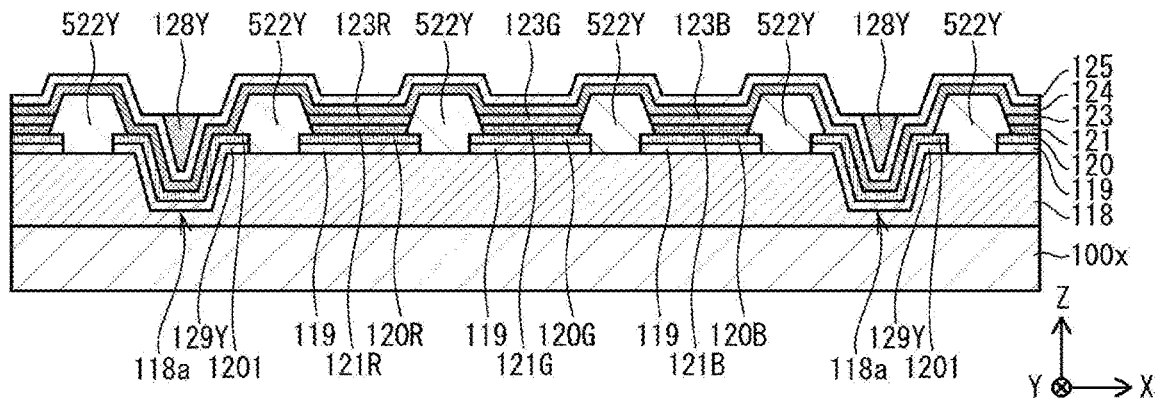

The auxiliary interconnects 128Y that are extended in the column direction and are formed of applied films are formed on the upper surface of the common electrode 125 located in the recessed parts 118a of the planarization layer 118. The auxiliary interconnects 128Y are formed as follows. Ink containing a constituent material composed mainly of silver (Ag) or aluminum (Al) is applied into the gaps 522zA defined by the column banks 522Y by using a wet process based on an inkjet method or gravure printing method in such a manner that the gaps 522zA are filled with the ink. Thereafter, the solvent is removed by volatilization or firing is carried out. Thereby, the surface of the ink is dropped, so that the auxiliary interconnects 128Y are formed as interconnect layers with a predetermined thickness (FIG. 6: step S14, FIG. 9D).

At this time, due to the existence of the recessed parts 118a in the gaps 522zA, the ink can be prevented from spilling over to the adjacent gap 522z and blocking the light emitting layer 123 in the gap 522z even when a large amount of ink is applied into the gap 522zA. Due to this, by making the recessed parts 118a in the gaps 522zA, the thickness of the auxiliary interconnects 128Y can be increased while leakage of the ink to the sub-pixels 100se is prevented.

The formed auxiliary interconnects 128Y become the state of being in contact with the upper surface of the common electrode 125 laid over the column banks 522Y and in the recessed parts 118a of the planarization layer 118.

Furthermore, the auxiliary interconnects 128Y can be allowed to have a desirable sectional shape by properly adjusting the volume of the recessed part 118a lower than the pinning position determined by the depth of the recessed part 118a, the liquid repellency of the common electrode 125, and the surface tension of the ink, the amount of ink dropping, the kind of solvent, and so forth, and the film thickness of the auxiliary interconnects 128Y can be adjusted to a desired value. For example, the sectional shape of the auxiliary interconnect 128Y obtained by cutting in parallel to the row direction may be set to a reverse tapered trapezoidal shape in which the lower side is tapered and the pinning position is set equal to or higher than the height of the upper edge of the recessed part 118a and the ratio of occupation of the flat part on the upper side is set equal to or higher than a predetermined value. This allows the auxiliary interconnect 128Y to have a predetermined thickness to thereby ensure a sectional area equivalent to that of the sectional shape of the recessed part 118a of the planarization layer 118 obtained by cutting in the row direction, which can lower the electrical resistance of the auxiliary interconnect 128Y.

[Forming of Sealing Layer 126]

Figure 10A:
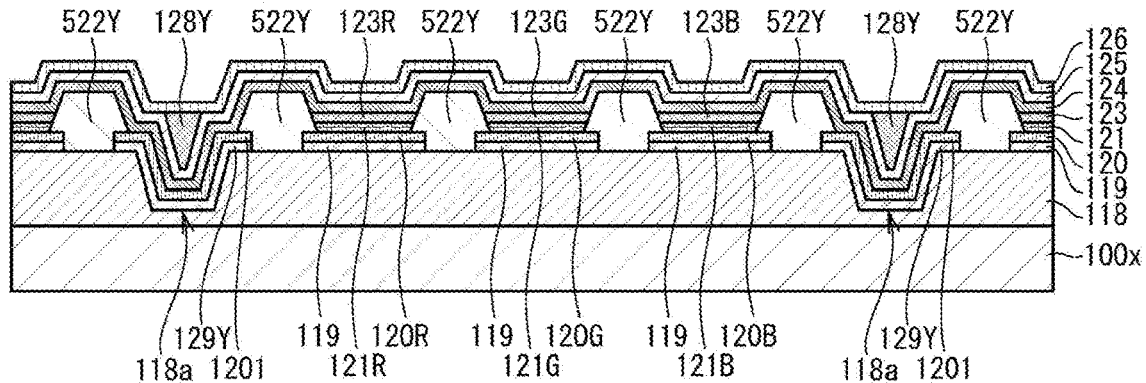
FIGS. 10A to 10C are schematic sectional views that depict the state in the respective steps in the manufacturing of the organic EL display panel and are obtained by cutting at the same position as line X1-X1 in FIG. 2.

The sealing layer 126 is formed to cover the range from the common electrode 125 to the peripheral edge of the planarization layer 118 of the substrate 100x (FIG. 6: step S15, FIG. 10A). The sealing layer 126 can be formed by using a chemical vapor deposition (CVD) method, sputtering method, or the like.

[Sticking of Front Surface Plate 131 and Back Panel]

Figure 10B:
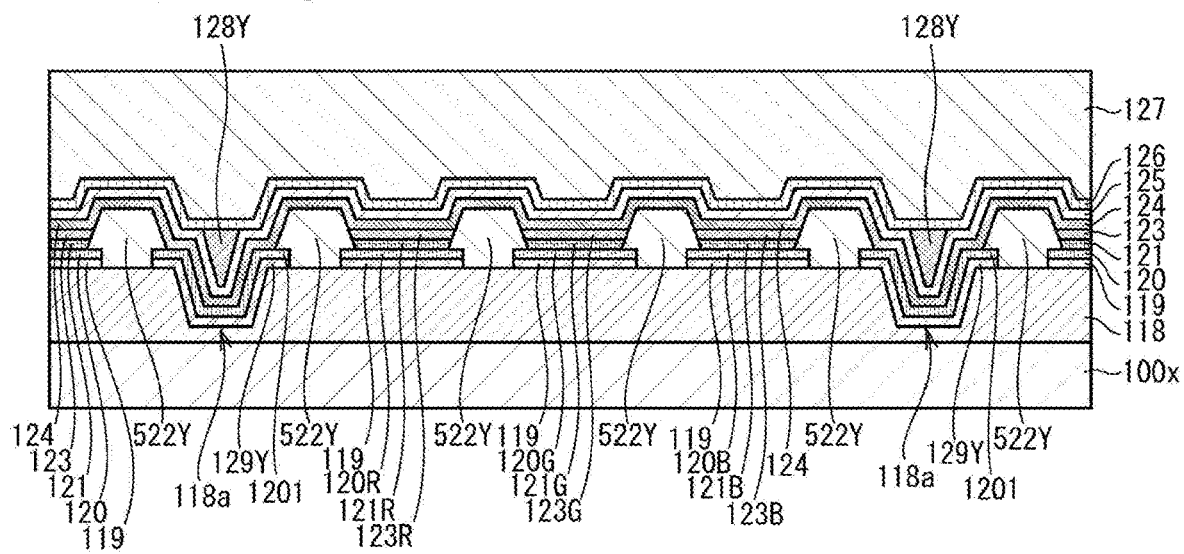

Next, the material of the joining layer 127 composed mainly of an ultraviolet-curable resin such as an acrylic resin, silicone resin, or epoxy resin is applied to the back panel composed of the respective layers from the substrate 100x to the sealing layer 126 (FIG. 10B).

Figure 10C:
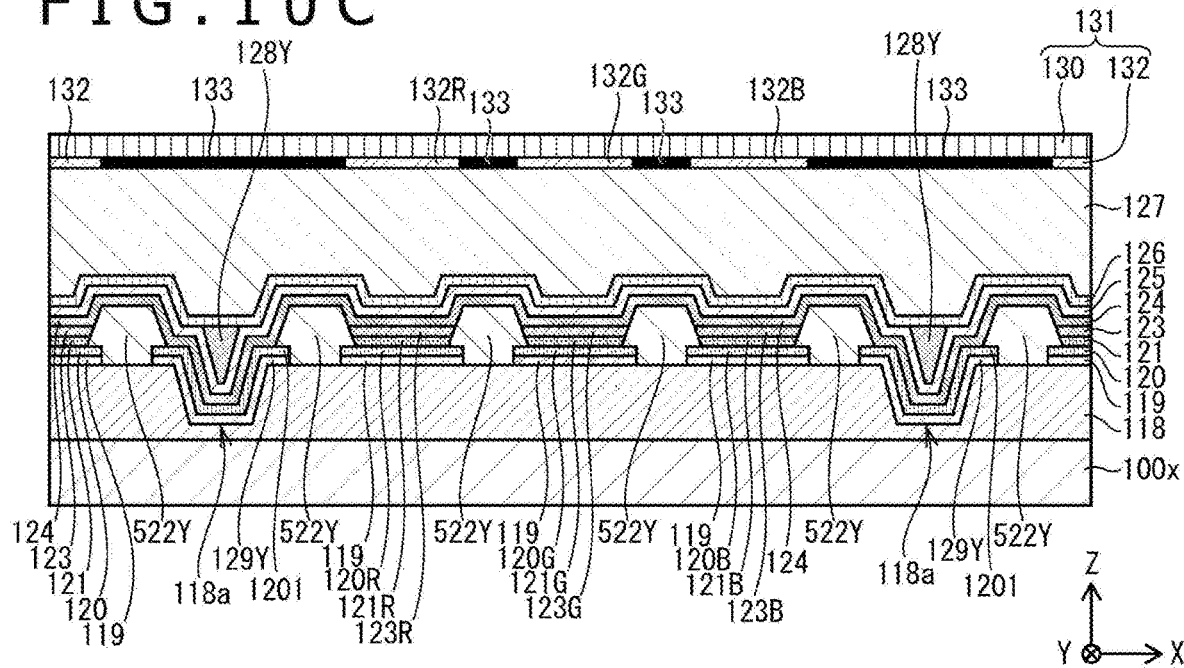

Subsequently, ultraviolet irradiation is carried out for the applied material and both substrates are stuck to each other in the state in which the relative positional relationship between the back panel and the front surface plate 131 is aligned. Thereafter, when both substrates are fired and the sealing step is completed, the display panel 10 is completed (FIG. 6: step S16, FIG. 10C).

<Effects>

Effects of the display panel 10 will be described below.

As described above, the organic EL display panel according to the embodiment includes the substrate 100x, the planarization layer 118 that is disposed on the upper surface of the substrate 100x and contains a resin material, the plural pixel electrodes 119 disposed in a matrix manner on the planarization layer 118, the light emitting layer 123 that is disposed on the pixel electrodes and contains an organic luminescent material, and the common electrode 125 that covers at least the upper side of the light emitting layer 123 and is disposed continuously in the plane direction. The elongated-shaped recessed part 118a is opened to extend in the column direction in at least one gap in the gaps between the pixel electrodes 119 adjacent to each other in the row direction on the planarization layer 118. The common electrode 125 is disposed continuously in the recessed part 118a of the planarization layer 118. The power feed auxiliary interconnect 128Y that extends in the column direction and is formed of an applied film is disposed on the upper surface of the common electrode 125 located in the recessed part 118a of the planarization layer 118.

According to this configuration, the auxiliary interconnect 128Y formed in the recessed part 118a can ensure a sectional area equivalent to that of the sectional shape of the recessed part 118a of the planarization layer 118 obtained by cutting in the row direction and is extended to the peripheral edge of the substrate 100x and is connected to the external connection terminal in the state in which the sectional area is ensured.

As a result, reduction in the resistance of the power feed path to the light emitting elements can be intended in the organic EL panel and luminance variation in the surface attributed to a voltage drop can be suppressed.

Furthermore, crosstalk attributed to the lowering of the responsiveness at the central part of the display panel is suppressed and the display quality can be improved.

Moreover, in another mode, a configuration may be employed in which two elongated-shaped column banks 522Y are further formed to extend in the column direction between the recessed part 118a and the pixel electrodes 119 each adjacent to the recessed part 118a on both sides in the row direction on the planarization layer 118 and the depth of the recessed part 118a of the planarization layer 118 is larger than the height of the column banks 522Y.

According to this configuration, the auxiliary interconnect 128Y has a predetermined thickness, which can lower the electrical resistance of the auxiliary interconnect 128Y.

Furthermore, a manufacturing method of the organic EL display panel according to the embodiment has preparing the substrate 100x, forming the planarization layer 118 that is disposed on the upper surface of the substrate 100x and contains a resin material, forming the plural pixel electrodes 119 in a matrix manner on the planarization layer 118, forming the light emitting layer 123 that is disposed on the pixel electrodes 119 and contains an organic luminescent material, and disposing the common electrode 125 continuously in the plane direction at least above the light emitting layer 123. In the forming the planarization layer 118, the elongated-shaped recessed part 118a is opened to extend in the column direction in at least one gap in the gaps between the regions in which the pixel electrodes 119 adjacent to each other in the row direction are to be formed on the planarization layer 118. In the disposing the common electrode 125, the common electrode 125 is formed continuously in the recessed part 118a of the planarization layer 118. The manufacturing method further has forming the power feed auxiliary interconnect 128Y that extends in the column direction and is formed of an applied film on the upper surface of the common electrode 125 located in the recessed part 118a of the planarization layer 118 after the disposing the common electrode 125.

According to this configuration, it is possible to manufacture an organic EL panel in which reduction in the resistance of the power feed path to the light emitting elements is intended and luminance variation in the surface attributed to a voltage drop is suppressed.

Moreover, in another mode, the following configuration may be employed. The manufacturing method further has forming two elongated-shaped column banks 522Y that extend in the column direction between the recessed part 118a and the pixel electrodes 119 each adjacent to the recessed part 118a on both sides in the row direction on the planarization layer 118 after the forming the pixel electrodes 119 and before the forming the light emitting layer 123. In the forming the power feed auxiliary interconnect 128Y, the power feed auxiliary interconnect 128Y is formed by applying ink containing a metal material into the gap between the column banks 522Y and drying the ink.

According to this configuration, due to the existence of the recessed part 118a in the gap 522zA, the ink can be prevented from spilling over to the adjacent gap 522z and blocking the light emitting layer 123 in the gap 522z even when a large amount of ink is applied into the gap 522zA. Due to this, the thickness of the auxiliary interconnect 128Y can be increased while leakage of the ink to the sub-pixels 100se is prevented.

Furthermore, in another mode, a configuration may be employed in which, in the forming the pixel electrodes 119, the lower-layer auxiliary interconnect 129Y that extends in the column direction and is formed of a vapor-deposited film is further formed in the recessed part 118a of the planarization layer 118 and under the common electrode 125.

According to this configuration, the section of the column bank 522Y adjacent to the recessed part 118a in the row direction can be allowed to have an equivalent shape in the row direction, and blocking of the light emitting layer 123 in association with spilling of ink to the gap 522z adjacent to the recessed part 118a in the row direction can be deterred.

MODIFICATION EXAMPLES

Although the display panel 10 according to the embodiment is described, the present disclosure is not limited by the above embodiment at all except for the essential characteristic constituent elements thereof. For example, modes obtained through execution of various modifications for the embodiment by those skilled in the art and modes implemented by any combination of constituent elements and functions in each embodiment without departing from the gist of the present disclosure are also included in the present disclosure.

In the following, modification examples of the display panel 10 will be described as one example of such modes.

Modification Example 1

Figure 11:
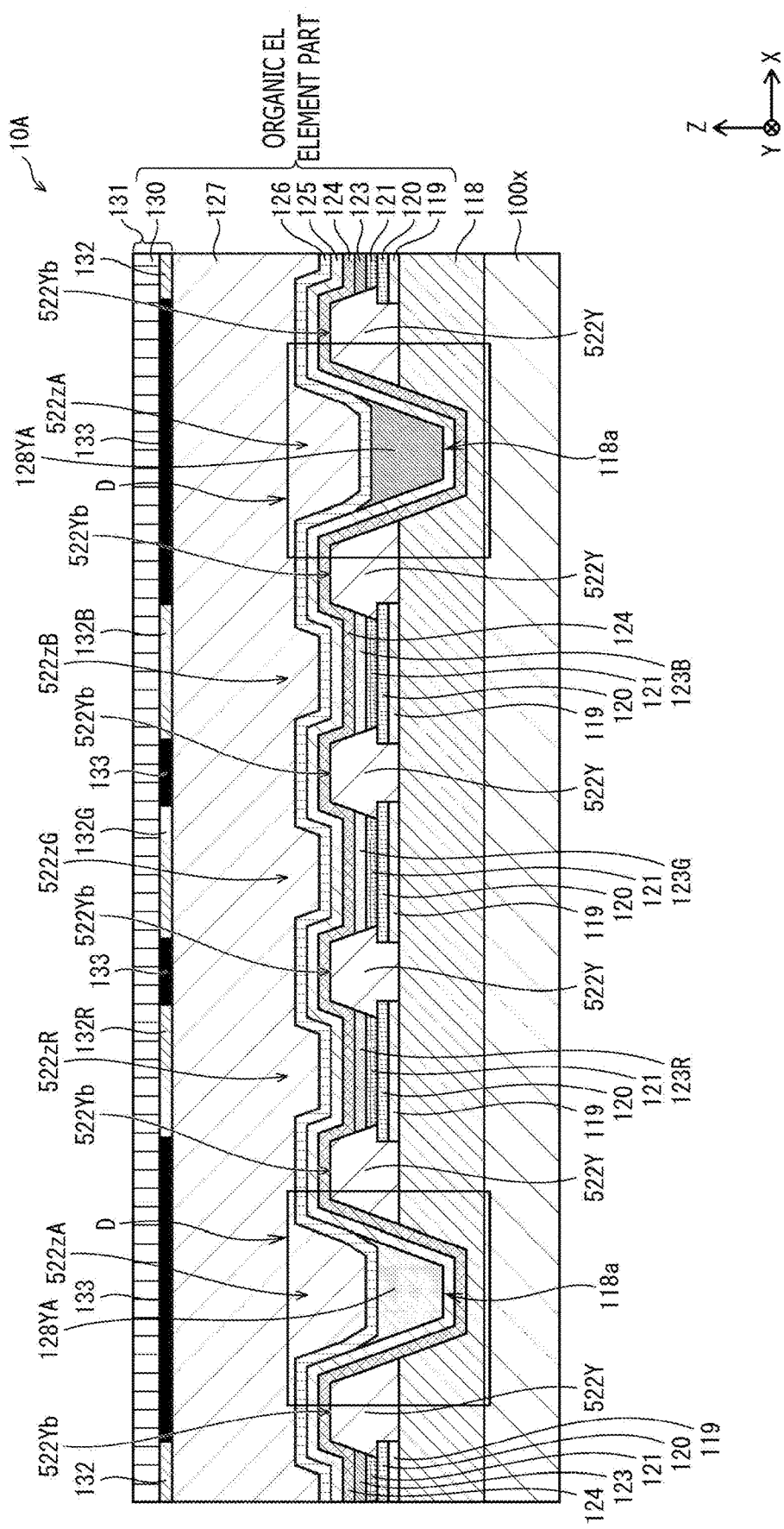
FIG. 11 is a schematic sectional view obtained by cutting a display panel according to modification example 1 at the same position as line X1-X1 in FIG. 2.

FIG. 11 is a schematic sectional view obtained by cutting a display panel 10A according to modification example 1 at the same position as line X1-X1 in FIG. 2.

In the display panel 10 according to the embodiment, as depicted in parts C in FIG. 3, the configuration is made in which, at the forming part of the auxiliary interconnect 128Y, the auxiliary interconnect 128Y is disposed to extend in the column direction above the layer-stacked body of the lower-layer auxiliary interconnect 129Y, the metal oxide layer 1201, and the electron transport layer 124 in the recessed part 118a.

In contrast, in the display panel 10A according to modification example 1, as depicted in parts D in FIG. 11, at a forming part of a power feed auxiliary interconnect 128YA (hereinafter, referred to as "auxiliary interconnect 128YA"), the lower-layer auxiliary interconnect 129Y and the metal oxide layer 1201 do not exist in the recessed part 118a and the auxiliary interconnect 128YA is disposed above the common electrode 125 laid in the recessed part 118a. In this point, the display panel 10A is different from the display panel 10.

In the display panel 10 according to the embodiment, electrical connection between the common electrode 125 and the lower-layer auxiliary interconnect 129Y involves certain electrical resistance due to the intervention of the electron transport layer 124 in the electrical conduction path.

On the other hand, in the display panel 10A, the sectional area of the auxiliary interconnect 128YA can be increased by an amount equivalent to the sectional area of the lower-layer auxiliary interconnect 129Y and the metal oxide layer 1201 in the recessed part 118a in the display panel 10. The auxiliary interconnect 128YA is in direct contact with the common electrode 125 and therefore increase in the sectional area of the auxiliary interconnect 128YA directly contributes to reduction in the electrical resistance of the auxiliary interconnect 128YA. For this reason, in the display panel 10A, the electrical resistance can be reduced compared with the display panel 10 by increasing the sectional area of the auxiliary interconnect 128YA instead of laying the lower-layer auxiliary interconnect 129Y and the metal oxide layer 1201 in the recessed part 118a.

That is, in the display panel 10A, the spaces for power feed ensured by making the recessed parts 118a of the planarization layer 118 can be utilized for reduction in the electrical resistance efficiently compared with the display panel 10.

Modification Examples 2 and 3

Figure 12A:
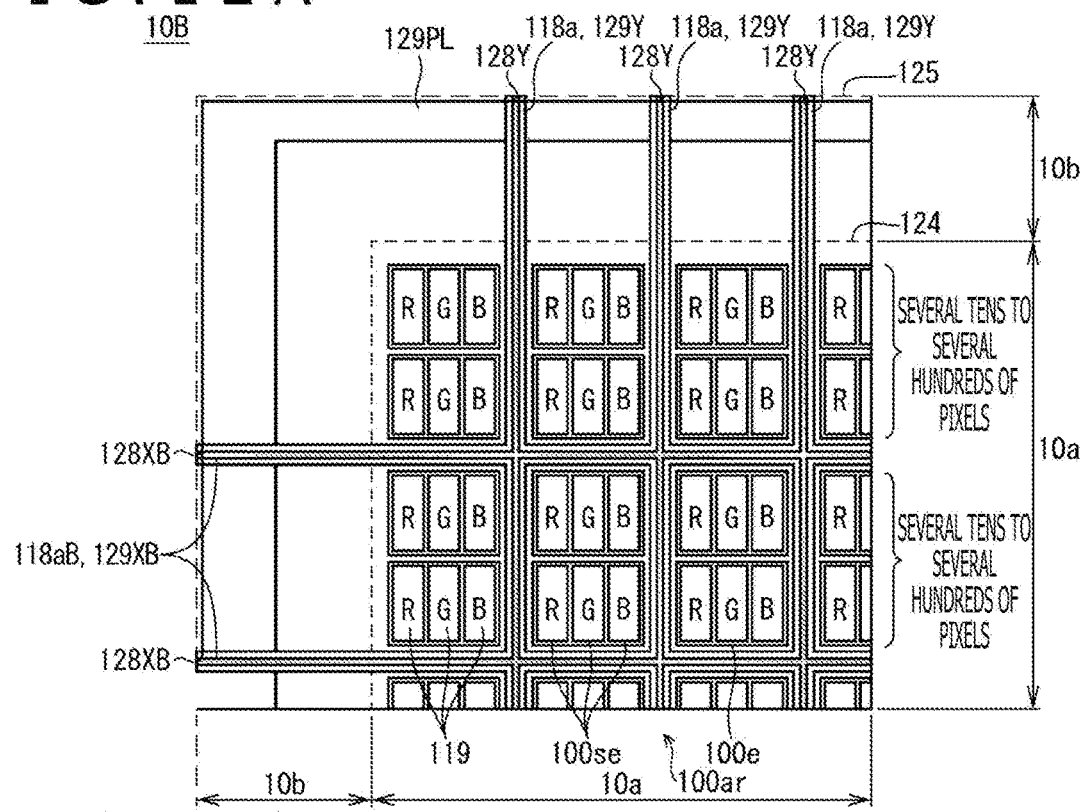
FIG. 12A is a schematic plan view of the same range as part B in FIG. 1 in a display panel according to modification example 2 and FIG. 12B is a schematic plan view of the same range as part B in FIG. 1 in a display panel according to modification example 3.

FIG. 12A is a schematic plan view of the same range as part B in FIG. 1 in a display panel 10B according to modification example 2.

In the display panel 10 according to the embodiment, the configuration is made in which, as depicted in FIG. 2, the plural lower-layer auxiliary interconnects 129Y are disposed in the auxiliary gaps 522zA continuously in the column direction between the unit pixels 100e over the substrate 100x.

In the display panel 10B according to modification example 2, as depicted in FIG. 12A, recessed parts 118aB that extend in the row direction are opened in the upper surface of the planarization layer 118 between the unit pixels 100e adjacent to each other in the column direction at every group of plural pixels of several tens to several hundreds of pixels, for example. Furthermore, lower-layer power feed auxiliary interconnects 129XB and power feed auxiliary interconnects 128XB (hereinafter, referred to as "lower-layer auxiliary interconnects 129XB" and "auxiliary interconnects 128XB") are formed to extend in the recessed parts 118aB and form a lattice shape with the lower-layer auxiliary interconnects 129Y and the auxiliary interconnects 128Y that extend in the column direction. In this point, the display panel 10B is different from the display panel 10 according to the embodiment. Hereinafter, the auxiliary interconnect 128XB and the auxiliary interconnect 128Y will be referred to as "auxiliary interconnect 128" when no discrimination is made between the row and column directions.

Figure 12B:
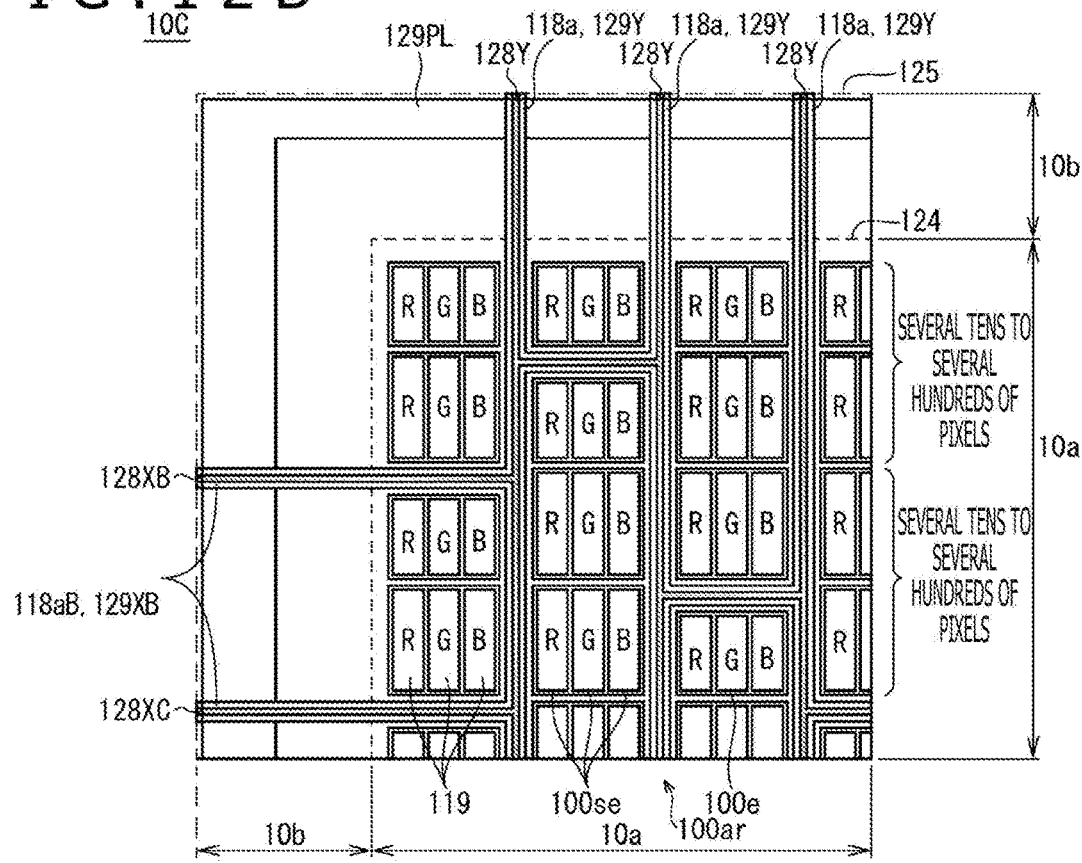

FIG. 12B is a schematic plan view of the same range as part B in FIG. 1 in a display panel 10C according to modification example 3.

In the display panel 10C according to modification example 3, as depicted in FIG. 12B, the recessed parts 118aB that extend in the row direction are opened in the upper surface of the planarization layer 118 between the unit pixels 100e adjacent to each other in the column direction at every group of plural pixels, and the lower-layer auxiliary interconnects 129XB and the power feed auxiliary interconnects 128XB are formed to extend in the recessed parts 118aB. In this point, the display panel 10C is the same as the display panel 10B.

Furthermore, in the display panel 10C, the position in the column direction at which the recessed part 118aB, the lower-layer auxiliary interconnect 129XB, and the auxiliary interconnect 128XB are formed differs for each unit pixel 100e in the row direction. In this point, the display panel 10C is different from the display panel 10B. Thus, in the display panel 10C, the lower-layer auxiliary interconnects 129XB and the auxiliary interconnects 128XB and the lower-layer auxiliary interconnects 129Y and the auxiliary interconnects 128Y that extend in the column direction form what is called a staggered shape.

According to this configuration, in the display panels 10B and 10C, the electrical resistance of the common electrode 125 is reduced also in the row direction in addition to the column direction and luminance variation in the surface attributed to a voltage drop can be reduced.

Figure 13:
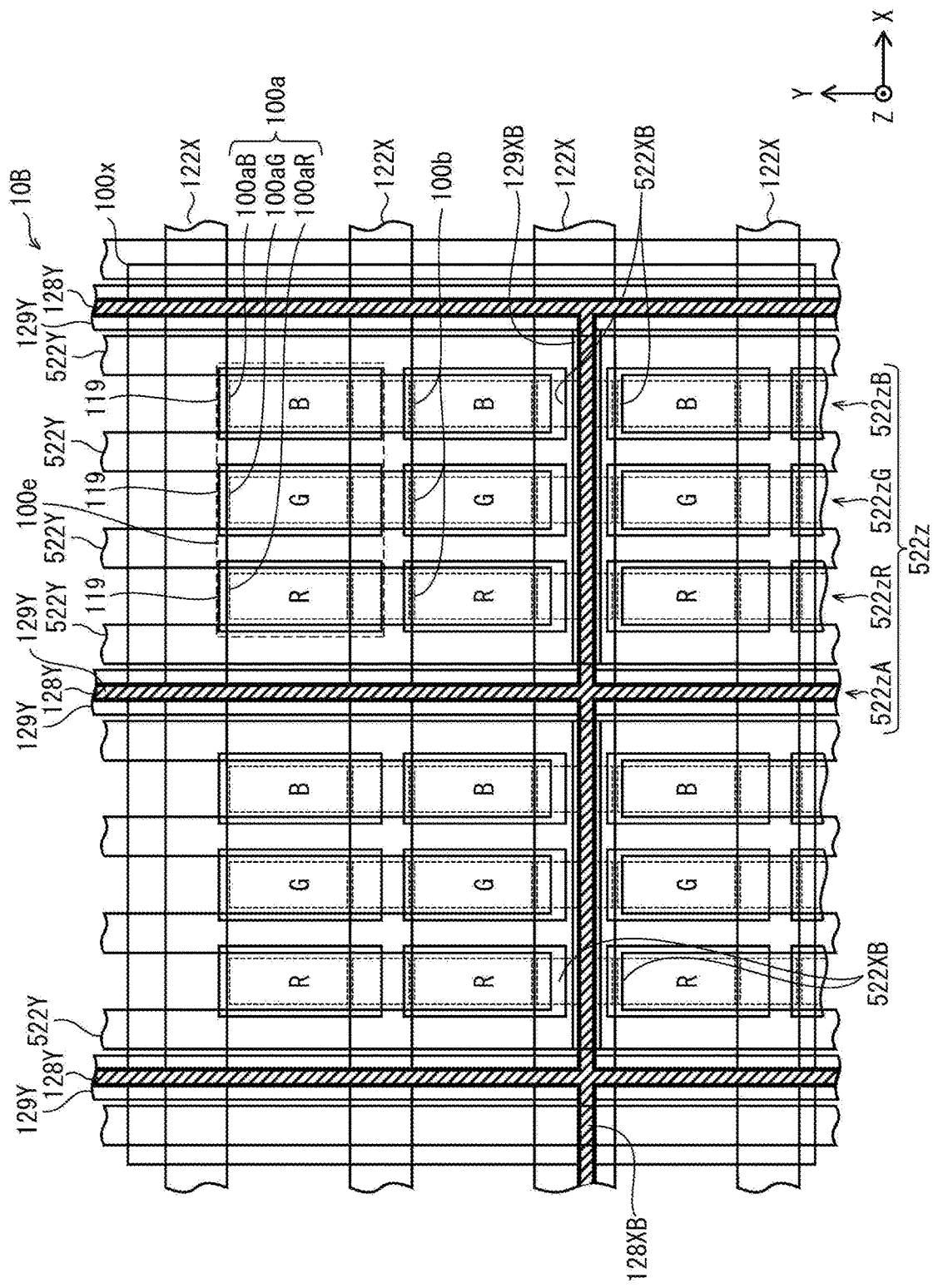
FIG. 13 is a schematic plan view of part of an image display region of the display panel.

FIG. 13 is a schematic plan view of part of the image display region 10a of the display panel 10B according to modification example 2. Furthermore, FIG. 14 is a schematic plan view of part of the image display region 10a of the display panel 10C according to modification example 3.

Figure 14:
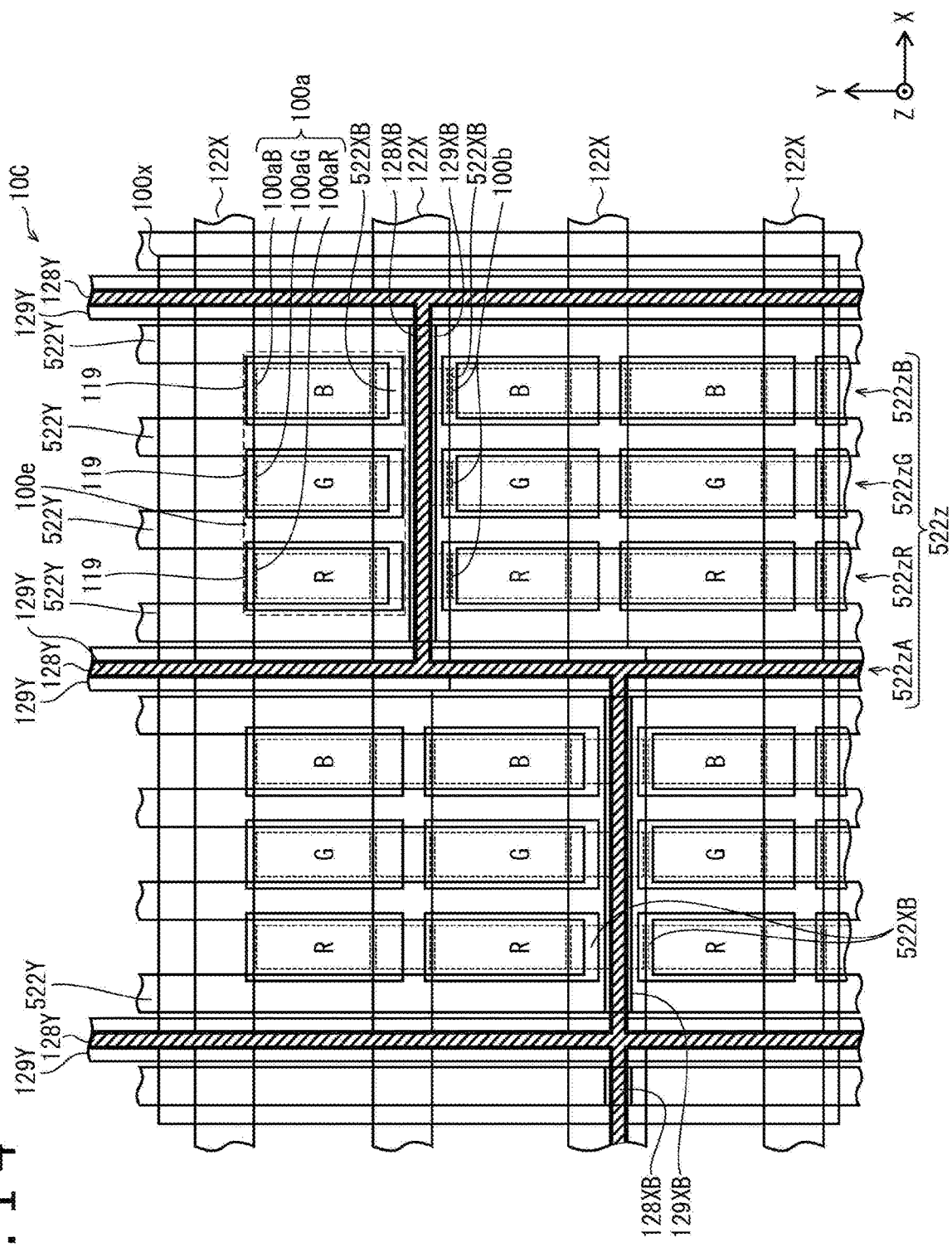
FIG. 14 is a schematic plan view of part of the image display region of the display panel.

In the display panels 10B and 10C, as depicted in FIG. 13 and FIG. 14, respectively, on the row bank 122X along which the lower-layer auxiliary interconnect 129XB and the auxiliary interconnect 128XB extend, the row bank 122X of the part corresponding to the recessed part 118aB in which both interconnects are laid does not exist. Furthermore, on the row bank 122X along which the auxiliary interconnect 128XB extends, a pair of row banks 522XB are formed to sandwich the recessed part 118aB from the column direction. The height of the row banks 522XB is higher than the row banks 122X and is the same as the column banks 522Y.

According to this configuration, when ink containing an organic luminescent material is applied into the gap 522z between the column banks 522Y in the forming step of the light emitting layers 123 in the manufacturing steps of the display panels 10B and 10C, the applied ink can be dammed up by the row bank 522XB. Thus, the ink can be prevented from flowing from the inside of the gap 522z into the recessed part 118aB in which the auxiliary interconnect 128XB is laid.

Furthermore, as described above, in the display panels 10B and 10C, the row banks 522XB are disposed at every group of plural pixels of several tens to several hundreds of pixels, for example. Therefore, the occurrence of luminance variation attributed to application variation of the ink on each sub-pixel basis in the column direction can be deterred.

Moreover, in the display panel 10C, the lower-layer auxiliary interconnects 129XB and the auxiliary interconnects 128XB and the lower-layer auxiliary interconnects 129Y and the auxiliary interconnects 128Y that extend in the column direction form what is called a staggered shape. Therefore, luminance variation in the column direction (horizontal streak) due to the existence of the lower-layer auxiliary interconnects 129XB and the auxiliary interconnects 128XB can be made inconspicuous.

Other Modification Examples

In the display panel 10 according to embodiment 1, the configuration is employed in which the light emitting layers 123 extend in the column direction continuously on the row banks. However, in the above-described configuration, a configuration may be employed in which the light emitting layers 123 are intermittent on each pixel basis on the row banks.

In the display panel 10, the configuration is employed in which the colors of light emitted by the light emitting layers 123 of the sub-pixels 100se disposed in the gaps 522z between the column banks 522Y adjacent in the row direction are different from each other, and the configuration is employed in which the colors of light emitted by the light emitting layers 123 of the sub-pixels 100se disposed in the gaps between the row banks 122X adjacent in the column direction are the same. However, in the above-described configuration, a configuration may be employed in which the colors of light emitted by the light emitting layers 123 of the sub-pixels 100se adjacent in the row direction are the same and the colors of light emitted by the light emitting layers 123 of the sub-pixels 100se adjacent in the row direction are different from each other. Furthermore, a configuration may be employed in which the colors of light emitted by the light emitting layers 123 of the adjacent sub-pixels 100se are different from each other in both the row and column directions.

In the display panel 10 according to the embodiment, there are three kinds of pixels 100e, i.e., red pixels, green pixels, and blue pixels. However, the present disclosure is not limited thereto. For example, only one kind of light emitting layer may exist or four kinds of light emitting layers that emit light of red, green, blue, and yellow may exist.

Furthermore, in the above-described embodiment, the configuration in which the pixels 100e are arranged in a matrix manner is employed. However, the present disclosure is not limited thereto. For example, when the interval of the pixel regions is defined as one pitch, techniques of the present disclosure have effects also for a configuration in which the pixel region is shifted by half pitch in the column direction between the gaps adjacent to each other. In the display panel, for which enhancement in the definition is being advanced, some shift in the column direction is difficult to discriminate in visual recognition and, even when film thickness unevenness lines up in a straight line having a certain level of width (or in a staggered manner), the unevenness becomes a strip manner in visual recognition. Therefore, also in such a case, the display quality of the display panel can be improved by suppressing lining-up of luminance unevenness into the above-described straight line manner.

Moreover, in the above-described embodiment, the configuration is employed in which the hole injection layers 120, the hole transport layers 121, the light emitting layers 123, and the electron transport layer 124 exist between the pixel electrodes 119 and the common electrode 125. However, the present disclosure is not limited thereto. For example, a configuration may be employed in which the hole injection layers 120, the hole transport layers 121, and the electron transport layer 124 are not used and only the light emitting layers 123 exist between the pixel electrodes 119 and the common electrode 125. Furthermore, for example, a configuration including hole injection layer, hole transport layer, electron transport layer, electron injection layer, and so forth or a configuration simultaneously including a plurality or all of them may be employed. In addition, these layers all do not need to be composed of an organic compound and may be composed of an inorganic substance or the like.

Furthermore, in the above-described embodiment, a configuration is employed in which a wet deposition process such as a printing method, spin coating method, or inkjet method is used as the forming method of the light emitting layers 123. However, the present disclosure is not limited thereto. For example, it is also possible to use a dry deposition process such as a vacuum evaporation method, electron-beam evaporation method, sputtering method, reactive sputtering method, ion plating method, or gas-phase growth method. Moreover, as the materials of the respective constituent parts, publicly-known materials can be employed as appropriate.

Moreover, in the above-described embodiment, the EL display panel of the top-emission type is employed as one example. However, the present disclosure is not limited by this. For example, it is also possible to apply techniques of the present disclosure to a display panel of the bottom-emission type, or the like. In this case, appropriate changes are possible regarding each configuration. Furthermore, it is also possible to apply techniques of the present disclosure to a quantum dot display device using colloidal quantum dots, or the like.

<Circuit Configuration>

Figure 15:
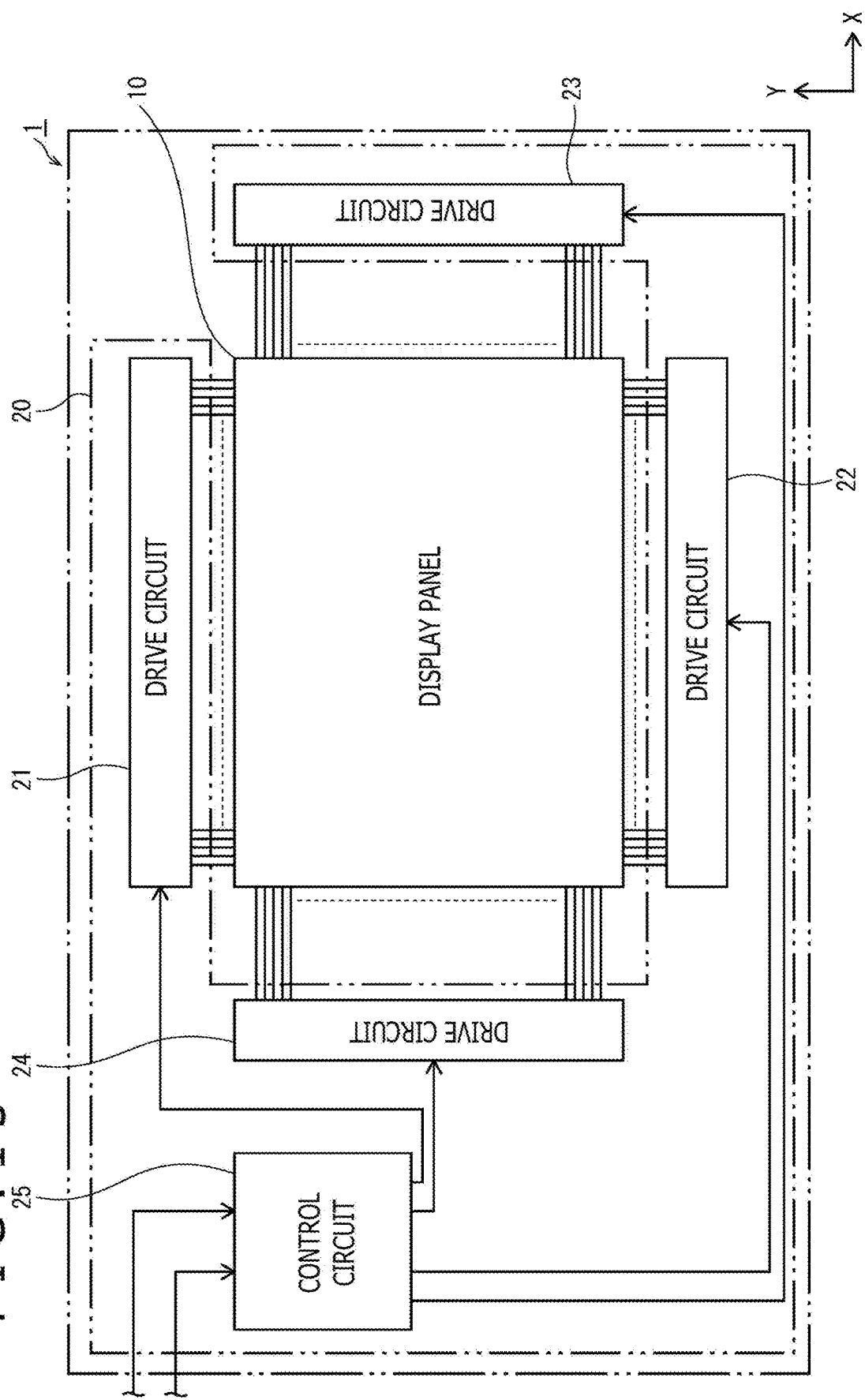
FIG. 15 is a schematic block diagram depicting the circuit configuration of an organic EL display device according to the embodiment.

In the following, the circuit configuration of the organic EL display device 1 according to the embodiment will be described. As depicted in FIG. 15, the organic EL display device 1 includes the display panel 10 and a drive control circuit unit 20 connected thereto. The drive control circuit unit 20 includes four drive circuits 21 to 24 and a control circuit 25.

Figure 16:
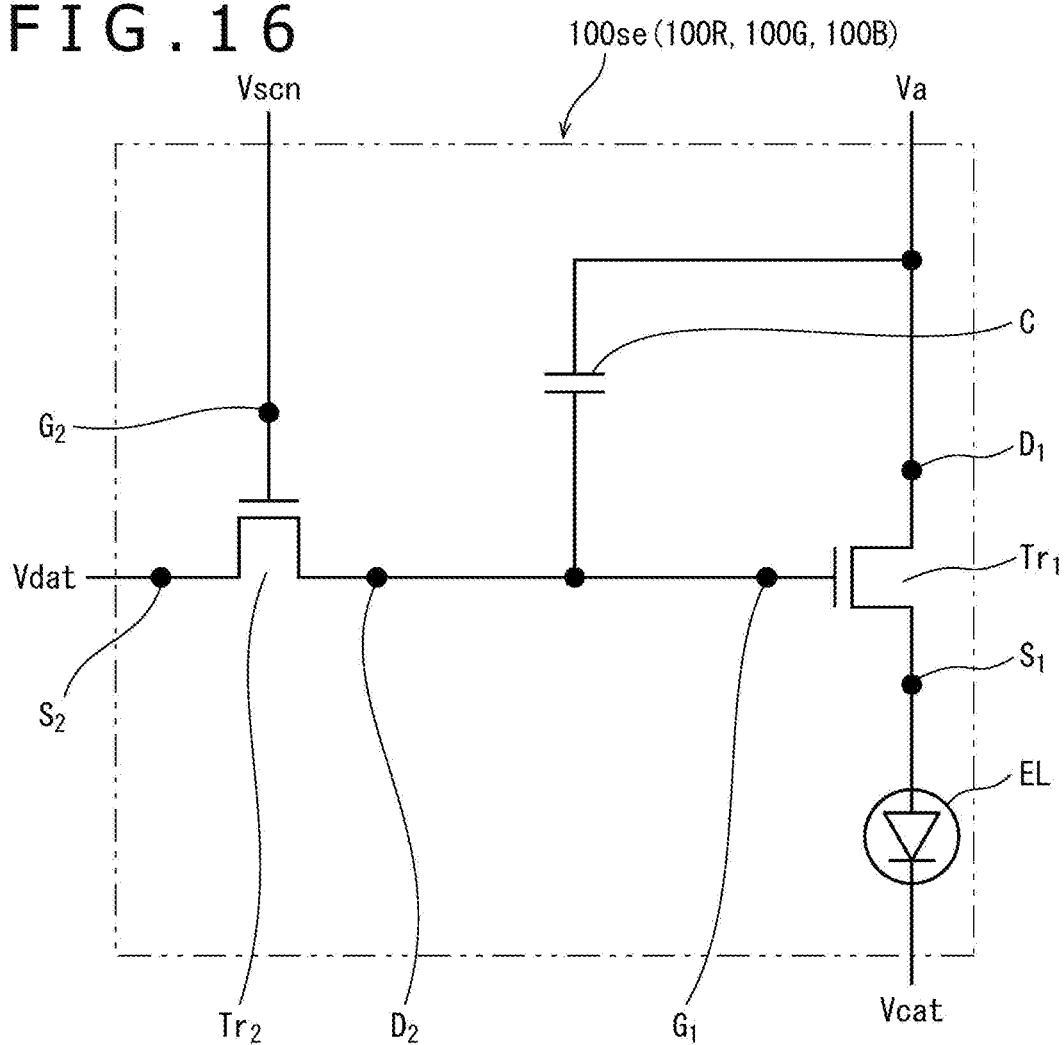
FIG. 16 is a schematic circuit diagram depicting a circuit configuration in each sub-pixel of the organic EL display panel used for the organic EL display device.

In the display panel 10, the plural pixels 100e are disposed in a matrix manner to configure a display region. Each pixel 100e includes three organic EL elements 100R, 100B, and 100G of the respective colors, i.e., three sub-pixels 100se that emit light of three colors, red (R), green (G), and blue (B). The circuit configuration of each sub-pixel 100se will be described. FIG. 16 is a circuit diagram depicting a circuit configuration in the organic EL elements 100R, 100B, and 100G of the respective colors corresponding to the respective sub-pixels 100se. In the display panel 10 according to the present embodiment, each sub-pixel 100se includes two transistors $Tr_1$ and $Tr_2$, one capacitor C, and an organic EL element part EL as a light emitting part. The transistor $Tr_1$ is a drive transistor and the transistor $Tr_2$ is a switching transistor.

A gate $G_2$ of the switching transistor $Tr_2$ is connected to a scanning line Vscn and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power supply line Va and a source $S_1$ is connected to a pixel electrode (anode) of the organic EL element part EL. A common electrode (cathode) in the organic EL element part EL is connected to a ground line Vcat.

A first end of the capacitor C is connected to the drain $D_2$ of the switching transistor $Tr_2$ and the gate $G_1$ of the drive transistor $Tr_1$. A second end of the capacitor C is connected to the power supply line Va.

In the display panel 10, a gate line is led out from the gate $G_2$ of each sub-pixel 100se and is connected to the scanning line Vscn connected from the external of the display panel 10. Similarly, a source line is led out from the source $S_2$ of each sub-pixel 100se and is connected to the data line Vdat connected from the external of the display panel 10.

Furthermore, the power supply lines Va of the respective sub-pixels 100se and the ground lines Vcat of the respective sub-pixels 100se are integrated to be connected to a power supply line and a ground line of the organic EL display device 1.

The configuration is employed in which the pixel electrode 119 that is the anode is disposed at the lower part of the EL element part and the pixel electrode 119 is connected to an interconnect connected to the source electrode of a TFT. However, it is also possible to employ a configuration in which the common electrode is disposed at the lower part of the EL element part and the anode is disposed at the upper part. In this case, the cathode disposed at the lower part is connected to the drain in the TFT.

Moreover, in the above-described embodiment, the configuration in which the two transistors $Tr_1$ and $Tr_2$ are disposed for one sub-pixel 100se is employed. However, the present disclosure is not limited by this. For example, a configuration in which one transistor is disposed for one sub-pixel may be employed or a configuration in which three or more transistors are disposed may be employed.

SUPPLEMENTS

The embodiment described above is what indicates preferred one specific example of the present disclosure. Numerical values, shapes, materials, constituent elements, the disposing positions and connection forms of constituent elements, steps, the order of steps, and so forth depicted in the embodiment are one example and do not intend to limit the present disclosure. Furthermore, steps that are not described in the independent claims indicating the highest concepts of the present disclosure in constituent elements in the embodiment are described as freely-selected constituent elements that configure more preferred forms.

Furthermore, the above-described order of execution of steps is order for exemplification for specific explanation of the present disclosure and may be order other than the above-described order. In addition, part of the above-described steps may be carried out simultaneously with (in parallel to) another step.

Moreover, for easy understanding of the present disclosure, the scale of the constituent elements in the respective diagrams cited in the above-described embodiment is different from the actual scale in some cases. In addition, the present disclosure is not limited by the description of the above embodiment and can be changed as appropriate without departing from the gist of the present disclosure.

Furthermore, at least part of functions of the embodiment and modification examples thereof may be combined.

Moreover, various modification examples obtained by implementing changes in such a range as to be conceived by those skilled in the art on the present embodiment are also included in the present disclosure.

The organic EL display panel and the organic EL display device according to one mode of the present disclosure can be widely used for devices such as television sets, personal computers, and mobile phones or other various pieces of electronic equipment having a display panel.

It should be understood by those skilled in the art that various modifications, combinations, sub-combinations and alterations may occur depending on design requirements and other factors insofar as they are within the scope of the appended claims or the equivalent thereof.

What is claimed is:

1. An organic electroluminescence display panel comprising:
   a substrate;
   a planarization layer configured to be disposed on an upper surface of the substrate and contain a resin material;
   a plurality of pixel electrodes configured to be disposed in a matrix manner on the planarization layer;
   a plurality of light emitting layers each configured to be disposed on each of the plurality of pixel electrodes and contain an organic luminescent material;
   a common electrode configured to cover at least an upper side of the plurality of light emitting layers and be disposed continuously in a plane direction; and
   an electrode plate configured to extend along a peripheral edge of the substrate outside a region in which the plurality of pixel electrodes exist in plan view on the planarization layer, wherein
   a recessed part is opened in the planarization layer to extend in a column direction in at least one gap between adjacent pixel electrodes of the plurality of pixel electrodes, the adjacent pixel electrodes being adjacent to each other in a row direction on the planarization layer,
   the common electrode is disposed continuously in the recessed part of the planarization layer,
   a power feed auxiliary interconnect that extends in the column direction and is formed of an applied film is disposed on an upper surface of the common electrode located in the recessed part of the planarization layer,
   the recessed part of the planarization layer is opened to vicinity of the peripheral edge of the substrate in plan view,
   the electrode plate is disposed continuously in the recessed part of the planarization layer, and
   the power feed auxiliary interconnect extends to an upper surface of the electrode plate in plan view.

2. The organic electroluminescence display panel according to claim 1, wherein
   two column banks are further formed to extend in the column direction between e recessed part and pixel electrodes of the plurality of pixel electrodes each adjacent to the recessed part on both sides in the row direction on the planarization layer, and
   a depth of the recessed part of the planarization layer is larger than a height of the two column banks.

3. The organic electroluminescence display panel according to claim 1, wherein
a lower-layer power feed auxiliary interconnect that extends in the column direction and is formed of a vapor-deposited film is disposed in the recessed part of the planarization layer and under the common electrode.

4. The organic electroluminescence display panel according to claim 1, wherein
the common electrode extends to the upper surface of the electrode plate in plan view.

5. The organic electroluminescence display panel according to claim 1, wherein
a depth of the recessed part of the planarization layer is at least 2 μm and at most 5 μm, and
the power feed auxiliary interconnect includes silver and has a thickness of at least 0.5 μm and at most 2 μm.

6. The organic electroluminescence display panel according to claim 3, wherein
the plurality of pixel electrodes and the lower-layer power feed auxiliary interconnect are formed of vapor-deposited films, and
the plurality of pixel electrodes and the lower-layer power feed auxiliary interconnect are composed of a same material.

7. The organic electroluminescence display panel according to claim 2, wherein
the common electrode is formed of a vapor-deposited film and is formed continuously above the two column banks.

8. The organic electroluminescence display panel according to claim 2, wherein
when the two column banks are defined as first column banks,
second column banks are further formed to extend in the column direction between second adjacent pixel electrodes of the plurality of pixel electrodes, the second adjacent pixel electrodes being adjacent to each other in the row direction on the planarization layer, and
the light emitting layer is formed of an applied film and is disposed continuously in the column direction in gaps between at least one of the first column banks and at least one of the second column banks and in gaps between the second column banks adjacent to each other in the row direction.

9. An organic electroluminescence display panel comprising:
a substrate;
a planarization layer configured to be disposed on an upper surface of the substrate and contain a resin material;
a plurality of pixel electrodes configured to be disposed in a matrix manner on the planarization layer;
a plurality of light emitting layers each configured to be disposed on each of the plurality of pixel electrodes and contain an organic luminescent material;
a common electrode configured to cover at least an upper side of the plurality of light emitting layers and be disposed continuously in a plane direction; and
an electrode plate configured to extend along a peripheral edge of the substrate outside a region in which the plurality of pixel electrodes exist in plan view on the planarization layer, wherein
a recessed part is opened in the planarization layer to extend in a column direction in at least one gap between adjacent pixel electrodes of the plurality of pixel electrodes, the adjacent pixel electrodes being adjacent to each other in a row direction on the planarization layer,
the common electrode is disposed continuously in the recessed part of the planarization layer,
a power feed auxiliary interconnect that extends in the column direction and is formed of an applied film is disposed on an upper surface of the common electrode located in the recessed part of the planarization layer,
the recessed part of the planarization layer is opened to an end point located outside the region in which the plurality of pixel electrodes exist and inside of an inner surface of the electrode plate in plan view,
the power feed auxiliary interconnect extends to the end point in plan view, and
the common electrode extends to the upper surface of the electrode plate in plan view.

10. An organic electroluminescence display panel comprising:
a substrate;
a planarization layer configured to be disposed on an upper surface of the substrate and contain a resin material;
a plurality of pixel electrodes configured to be disposed in a matrix manner on the planarization layer;
a plurality of light emitting layers each configured to be disposed on each of the plurality of pixel electrodes and contain an organic luminescent material; and
a common electrode configured to cover at least an upper side of the plurality of light emitting layers and be disposed continuously in a plane direction, wherein
a recessed part is opened in the planarization layer to extend in a column direction in at least one gap between adjacent pixel electrodes of the plurality of pixel electrodes, the adjacent pixel electrodes being adjacent to each other in a row direction on the planarization layer,
the common electrode is disposed continuously in the recessed part of the planarization layer,
a power feed auxiliary interconnect that extends in the column direction and is formed of an applied film is disposed on an upper surface of the common electrode located in the recessed part of the planarization layer,
when the recessed part is defined as a first recessed part and the power feed auxiliary interconnect is defined as a first power feed auxiliary interconnect, a second recessed part is further opened to extend in the row direction at least one gap between adjacent pixel electrodes of the plurality of pixel electrodes adjacent to each other in the column direction on the planarization layer, the common electrode is disposed continuously in the second recessed part of the planarization layer, and a second power feed auxiliary interconnect that extends in the row direction and is formed of an applied film is disposed on the upper surface of the common electrode located in the second recessed part of the planarization layer,
two row banks are formed to extend in the row direction between the second recessed part and pixel electrodes of the plurality of pixel electrodes each adjacent to the second recessed part on both sides in the column direction on the planarization layer, and
a height of the two row banks is smaller than a depth of the second recessed part.

11. The organic electroluminescence display panel according to claim 10, wherein the second recessed part and the second power feed auxiliary interconnect are disposed between every group of the plurality of pixel electrodes in the column direction.

* * * * *